US005491356A

United States Patent [19]
Dennison et al.

[11] Patent Number: 5,491,356
[45] Date of Patent: Feb. 13, 1996

[54] CAPACITOR STRUCTURES FOR DYNAMIC RANDOM ACCESS MEMORY CELLS

[75] Inventors: Charles Dennison; Pierre Fazan, both of Boise, Id.

[73] Assignee: Micron Technology, Inc., Boise, Id.

[21] Appl. No.: 153,124

[22] Filed: Nov. 15, 1993

Related U.S. Application Data

[63] Continuation-in-part of Ser. No. 599,624, Nov. 19, 1990, abandoned.

[51] Int. Cl.$^6$ .................... H01L 27/108; H01L 29/76; H01L 29/94; H01L 31/119
[52] U.S. Cl. .................... 257/306; 257/309; 257/534; 437/48
[58] Field of Search .................... 257/306, 303, 257/309, 534, 532; 437/48, 52, 60, 919

[56] References Cited

U.S. PATENT DOCUMENTS

| | | | |
|---|---|---|---|
| 4,754,313 | 6/1988 | Takemae et al. | 357/41 |
| 4,951,175 | 8/1990 | Kurosawa et al. | 257/303 |
| 5,045,899 | 9/1991 | Arimoto | 357/23.6 |
| 5,059,548 | 10/1991 | Kim | 437/52 |
| 5,172,201 | 12/1992 | Suizu | 257/303 |

FOREIGN PATENT DOCUMENTS

| | | | |
|---|---|---|---|
| 2-94554 | 4/1990 | Japan | 257/306 |

OTHER PUBLICATIONS

S. Inque, et al., "A Spread Stacked Capacitor (SSC) Cell for 64 Mbit DRAMs," ULSI Research Center, Toshiba Corporation, 1, Komukai Toshiba-cho, Saiwai-ku, Kawasaki 210, Japan, IUEDM 89-31, p. 2.3.1.

T. Ema, et al, "3–Dimensional Stacked Capacitor Cell for 16M and 64M DRAMs," MOS Division, Fujitsu Limited SKawasaki, Japan, Fujitsu Laboratories Limited, Atsugi, Japan, 592–IDEM 88.

Primary Examiner—Sara W. Crane
Attorney, Agent, or Firm—Workman Nydegger Seeley

[57] ABSTRACT

A three dimensional capacitor structure particularly adapted for use as a memory cell capacitor of a DRAM is disclosed. The capacitor structure incorporates the substantially vertical (in relation to the substrate) sides of a plurality of spacers into the storage node capacitor to increase the total area of the storage node capacitor. In the described embodiments of the invention, a first spacer and a second spacer are formed next to the digit lines. The bottom storage node plate is formed on at least the first sides of the spacers to increase area of the storage node. The bottom storage node plate is also formed on the upper surface of the digit line. Additional spacers can also be added to further increase the area of the storage node. A dielectric layer is formed over the first capacitor plate and a second capacitor plate layer is formed over the dielectric layer to complete the structure.

23 Claims, 18 Drawing Sheets

CAPACITOR STRUCTURES FOR DYNAMIC RANDOM ACCESS MEMORY CELLS

This is a continuation-in-part of application Ser. No. 07/599,624, filed on Nov. 19, 1990, now abandoned.

BACKGROUND

1. The Field of the Invention

This invention relates to integrated circuit structures. More particularly, the present invention relates to capacitive structures used with dynamic random access memory cells formed on integrated circuits.

2. The Background Art

The miniaturization of electrical components and their integration on a single piece of semiconductor material has been the catalyst of a world-wide information revolution. As integrated circuit technology has progressed, it has been possible to store ever increasing amounts of digital data in a smaller space at less expense and still access the data randomly, quickly, and reliably. Central to this greatly increased ability to store and retrieve data has been the dynamic random access memory, or DRAM, fabricated as an integrated circuit.

In the case of mass produced DRAMs, the cost per bit of memory decreases as the number of bits which can be reliably stored on each integrated circuit increases. Thus, it is advantageous to pack as many memory cells as practically possible on each square unit of planar area available on an integrated circuit.

The memory cells of DRAMs are comprised of two main components: a transistor and a capacitor. The capacitor of each memory cell functions to store an electrical charge representing a digital value (e.g., a charged capacitor representing a 1 and a discharged capacitor representing a 0) with the transistor acting as a switch to connect the capacitor to the "outside world" via decoding and other circuitry.

The state of the art has progressed to where the transistor can be made much smaller than the capacitor. In order to function properly the capacitor must possess a minimum amount of capacitance. Generally, it is desirable that each memory cell capacitor, often generally referred to as a "memory cell," possess at least $20 \times 10^{-15}$ farads, and preferably more, of charge storage capacity. If a capacitor exhibits too little capacitance, it will loose any charge placed upon it too rapidly causing errors in data storage.

The capacitive value of a capacitor is dependent upon the dielectric constant of the material placed between the plates of the capacitor, the distance between the plates, and the effective area of the plates. In the case of integrated circuits, the material used as a dielectric between the plates is generally limited to only a few materials. Also, the minimum distance between the capacitor plates is generally limited to a particular value; once that value is exceeded, the occurrence of defects becomes unacceptably high. Thus, the one parameter which can be varied to obtain an increased storage capacity is the area of the plates.

Thus, it is a goal of DRAM designers to increase the area of the capacitor plates as much as possible. Concurrently, it is also a goal to reduce the planar area occupied by the capacitor to a minimum so that as many memory cells as possible can be packed onto a single integrated circuit. Thus, various three dimensional structures have been proposed and adopted in the art to maintain the capacitive value of the capacitor at a desirably high level while keeping the planar area devoted to the capacitor at a minimum.

Among the proposed schemes for maintaining cell capacitance while decreasing the planar area devoted to the cell is a fin-like structure. See T. Ema, et. al., "3-dimensional Stacked Capacitor Cell for 16M and 64M DRAMS," *Int'l. Electron Devices Meeting Tech. Digest* 592–595 (1988). Disadvantageously, the process proposed in the Ema paper is not easy to scale down since the polysilicon node contact formation has to be aligned very precisely between two adjacent word lines and also between two adjacent bit or digit lines. Further, the process described in the Ema paper requires that the storage node precisely overlap the storage node contact. All these alignment tolerances will significantly increase the cell size for a given photolithography tool capacity. The structure described in the Ema paper presents multiple fabrication difficulties in view of present state of the art techniques available to maintain alignment of integrated circuit structures.

Other proposed schemes for maintaining or increasing cell capacitance in a decreasing planar area use a spread stacked capacitor See S. Inoue, et.al., "A Spread Stacked Capacitor (SSC) Cell for 64MBit DRAMs," *Int'l. Electron Devices Meeting Tech. Digest* 31–34 (1989). Disadvantageously, the process described in the Inoue paper is particularly complicated and requires at least two additional mask steps to form the structures and cannot be made with self aligning contacts thereby increasing the cell size for a given photolithography tool capability.

In view of the foregoing, it would be an advance in the art to provide a structure and method for forming an integrated circuit capacitor structure which provides increased capacitance without unduly adding processing steps to the fabrication of the integrated circuit and which includes self aligning structures. It would be another advance in the art to provide a structure and method for forming an integrated circuit capacitor structure which provides a higher capacitance per square unit of planar area and which can be reliably manufactured and operated and which is particularly adapted for integration into DRAM memory cells.

BRIEF SUMMARY AND OBJECTS OF THE INVENTION

In view of the above described state of the art, the present invention seeks to realize the following objects and advantages.

It is a primary object of the present invention to provide a structure for, and a method for forming, an integrated circuit capacitor which provides greater capacitance per unit of planar area without unduly adding processing steps or complexity to the fabrication of the overall integrated circuit.

It is also an object of the present invention to provide a structure and method for forming an integrated circuit capacitor which provides a higher capacitance per unit of planar area and which includes a self aligning storage node contact.

It is another object of the present invention to provide a structure and method for forming an integrated circuit capacitor which provides a greater charge storage capacity per unit of planar area and which can be reliably manufactured and operated.

It is still another object of the present invention to provide a structure and method for forming an integrated circuit capacitor which provides a high capacitance per unit of planar area and which is particularly adapted for integration into DRAM memory cells.

These and other objects and advantages of the invention will become more fully apparent from the description and claims which follow, or may be learned by the practice of the invention.

The present invention comprises a three dimensional capacitor structure particularly adapted for use as a memory cell capacitor of a DRAM. When included as part of a DRAM memory cell, the capacitor structure increases the capacitance (and thus the charge stored on the structure) by up to 300% over conventional planar capacitor structures occupying the same planar area. The capacitor structure incorporates a vertical (in relation to the substrate) area component into the storage node capacitor and utilizes it to its full advantage.

The capacitor structure of the present invention includes a plurality of vertical spacers. The vertical spacers are adapted for supporting additional layers of material formed on their sides. The spacers each include first and second preferably vertical, parallel sides.

A first capacitor plate layer is formed on at least a first side of the first spacer and at least a first side of the second spacer, and any surface adjoining the two spacers. The first capacitor plate functions as the storage node of the memory cell and a storage node contact is made between the first capacitor plate and the substrate.

A dielectric layer is provided over the first capacitor plate and a second capacitor plate is provided over the dielectric layer. The present invention thus uses the preferably substantially vertical sides of a plurality of spacers to impart greater area to the first capacitor plate. The spacers preferably comprise elongated protrusion-like structures which extend substantially perpendicularly from the plane of the substrate.

In one embodiment of the present invention, herein referred to as an M cell, the first and second spacers are formed immediately adjacent to a first bit or digit line and a second bit or digit line, respectively. In the M cell embodiment, the spacers are formed higher than the completed height of the bit or digit lines and the first capacitor plate is formed on at least a portion of the tops of the bit or digit lines, on at least a portion of both sides of the spacers, and on the area between the spacers. Thus, the area of the capacitor has been increased by at least the vertical component of the spacers without increasing the planar area devoted to the capacitor.

In another embodiment of the present invention, herein referred to as a Wave cell, the first and second spacers are also formed immediately adjacent to a first bit or digit line and a second bit or digit line, respectively. In the Wave cell embodiment, third and fourth spacers are also formed between the first and second spacers. The first capacitor plate is formed on top of at least a portion of the digit lines, on one side of each of the first and second spacers, on both sides of the third and fourth spacers, and on the area between the spacers. Thus, in the Wave cell embodiment, the area of the capacitor has been further increased by the vertical component of four spacers without increasing the planar area devoted to the capacitor structure.

BRIEF DESCRIPTION OF THE DRAWINGS

In order that the manner in which the above-recited and other advantages and objects of the invention are obtained can be appreciated, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention and the presently understood best mode thereof will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
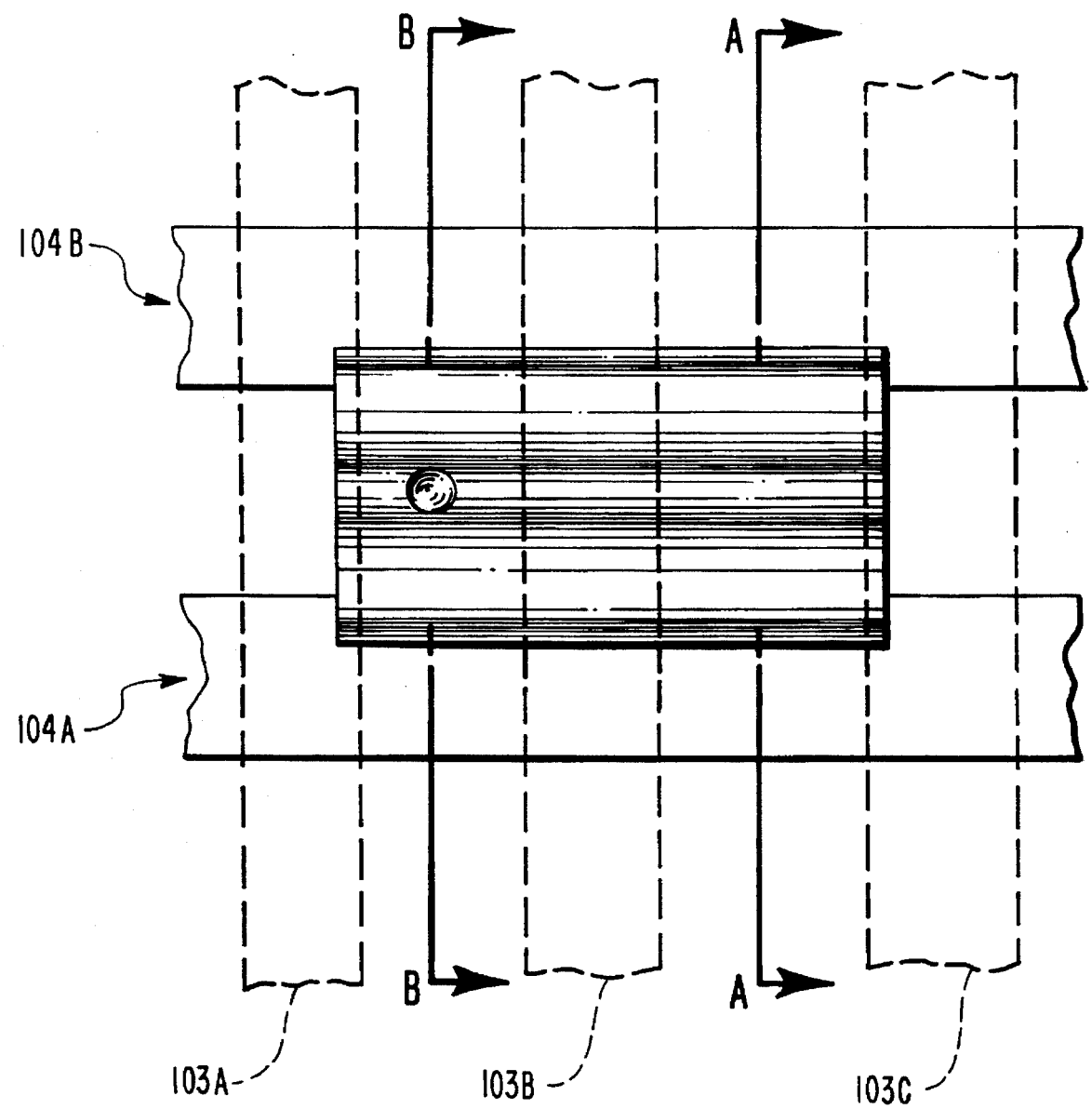
FIG. 1 is a top view of a partially completed first M memory cell embodiment, or M cell, of the present invention wherein section line A—A represents the view of FIGS. 2A–8A and wherein section line B—B (taken through the storage node contact) represents the view of FIGS. 2B–8B.

FIG. 1 is a top view of a partially completed first M memory cell, or M cell, of the present invention. The view provided in FIG. 1 represents the bottom capacitor plate of the memory cell. In FIG. 1, only the bottom capacitor plate of only one memory cell is represented to maximize the clarity of the figure. However, many capacitors may be stacked on top of one another to accommodate side by side positioning of the memory cells.

Figure 7A:
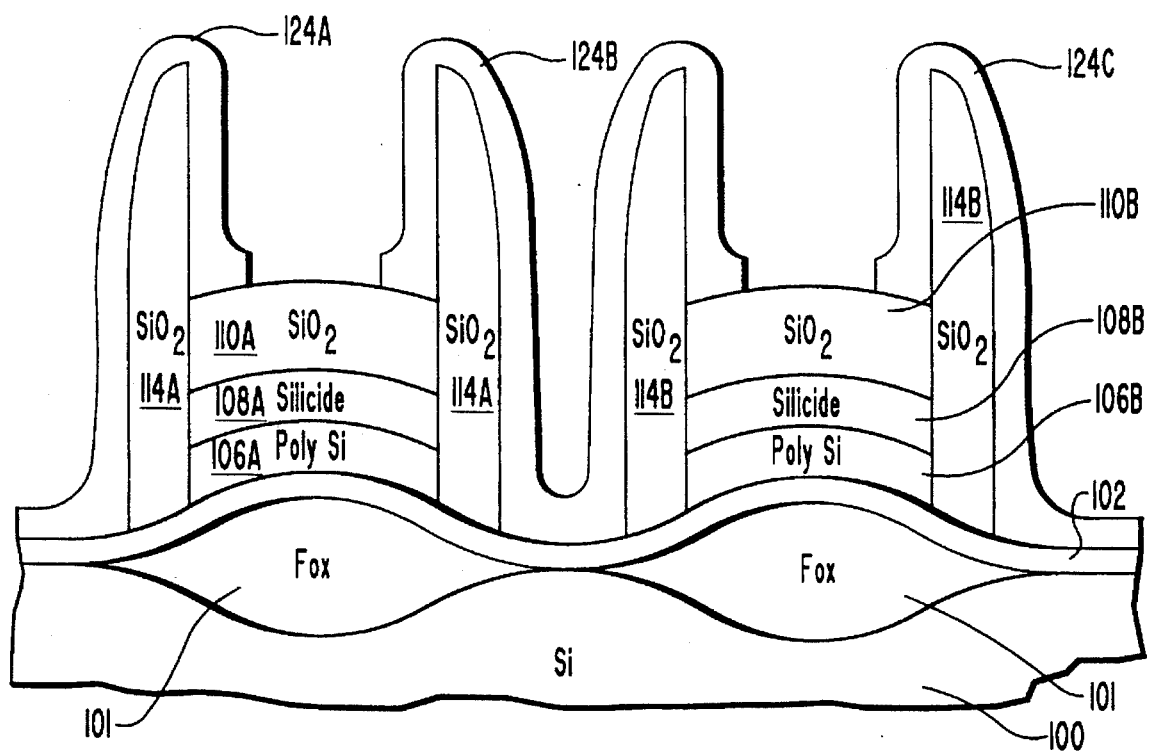
FIGS. 7A–7B represent the formation of the M memory cell capacitor bottom plate.
Figure 15A:
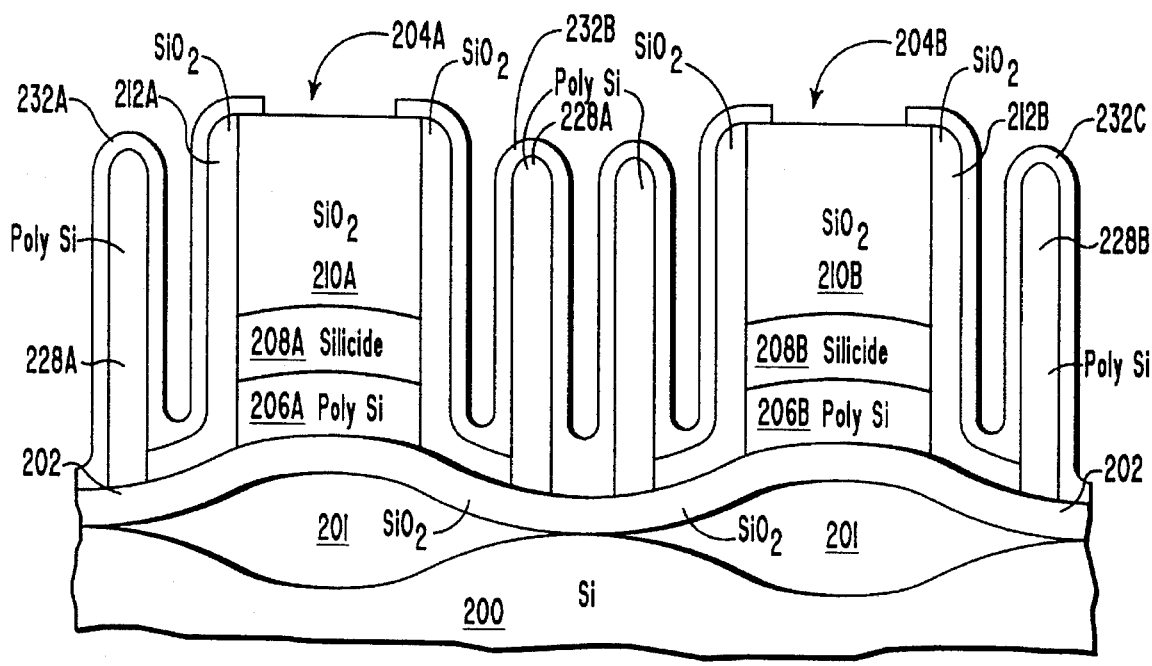
FIGS. 15A–15B represent the formation of the Wave memory cell capacitor bottom plate.

The embodiments of the present invention which are described herein are generally referred to as an M memory cell, or M cell, and a Wave memory cell, or Wave cell. The labels "M cell" and "Wave cell" are due to the similarity of the dielectric layer of the cell capacitor to an M shape or a Wave shape when viewed in cross section as shown in FIGS. 7A and 15A, respectively.

In FIG. 1, section line A—A represents the cross sectional view from which FIGS. 2A–8A are taken. Section line B—B represents the cross sectional view from which FIGS. 2B–8B are taken. Views taken through line B—B show the cell topology at the memory cell storage node contact.

As explained earlier, it is a challenge to designers of DRAMs to maintain the level of charge stored by each cell as the packing density of the integrated circuit increases and the planar area devoted to each cell decreases. In view of the difficulties encountered with prior attempts to further decrease the thickness of the dielectric layer or to increase the dielectric constant of the dielectric material, the present invention increases the amount of charge which each memory cell can store per unit of planar area by incorporating a substantially vertical component into the area of the capacitor plates.

While the herein described method is preferred for forming the structures of the present invention, the present invention may desirably make use of other steps to form the described structures. By utilizing the herein described three dimensional capacitor structure, the present invention increases the capacitance of the structure per square unit of planar space occupied by the structure. Moreover, the present invention may be used in devices other than DRAMs.

Still further, the present invention achieves its advantages while, in its described preferred embodiments, not requiring any additional photolithographic step and while avoiding unduly complex fabrication steps. Moreover, the present invention provides the advantageous feature that the storage node contact is fully self aligned. Consequently, the storage node does not need to expand past the storage node contact, nor does the storage node contact need to be placed accurately between digit lines and word lines, allowing the cell to be scaled down further for a given photolithography capability.

The following description will explain the principal fabrication steps necessary to make the described embodiments of the present invention. Preliminarily to describing the steps and the structures of the present invention, the steps known in the art for fabricating DRAMs will be briefly explained to provide a complete setting for the description of the preferred embodiments of the present invention. Then, the figures will be referenced to describe the embodiments of the present invention.

First during the fabrication of DRAMs, as is known in the art, the definition of field areas and active areas on the substrate occurs. The field areas are used to isolate active devices from each other and are generally formed with a thick oxide growth. The active areas are generally covered with a gate oxide.

Next, the formation of word lines occurs. The word lines also form the gates of the access devices, generally field effect transistors. Typically, the word lines, represented in phantom image at 103A-C in FIG. 1, are formed by depositing a polysilicon layer (1000 Å to 3000 Å), a silicide layer (1000 Å to 2000 Å), and a silicon dioxide layer (2000 Å to 4000 Å). Word line spacers are next formed to isolate the word lines from future digit line deposition and to offset the source drain implants from the transistors. The source and drain regions of the access devices are also doped with appropriate materials. Following the formation of the word lines, their associated structures, and the source and drain regions, an oxide layer is deposited to isolate active areas which are exposed and contacts for the digit lines are opened in specific areas.

In the following description of the M cell embodiment of the present invention, reference will be made to FIGS. 2–8. In FIGS. 2–8, as well as in FIGS. 10–16 illustrating the Wave cell embodiment of the present invention, only one storage node (also referred to herein as a storage capacitor) is represented in cross section. Other storage nodes to be included in the DRAM can be similarly fabricated.

In the following figures labeled with a "B" suffix, the cross section is taken through the storage node contact. Thus, in figures which represent fabrication steps taken prior to storage node contact formation, both figures labeled with an "A" and a "B" suffix will show relatively identical structures. Alternatively, in figures which represent fabrication steps taken during or after storage node contact formation, the figures labeled with an "A" will show a different structure than those labeled with a "B" suffix.

Figure 2A:
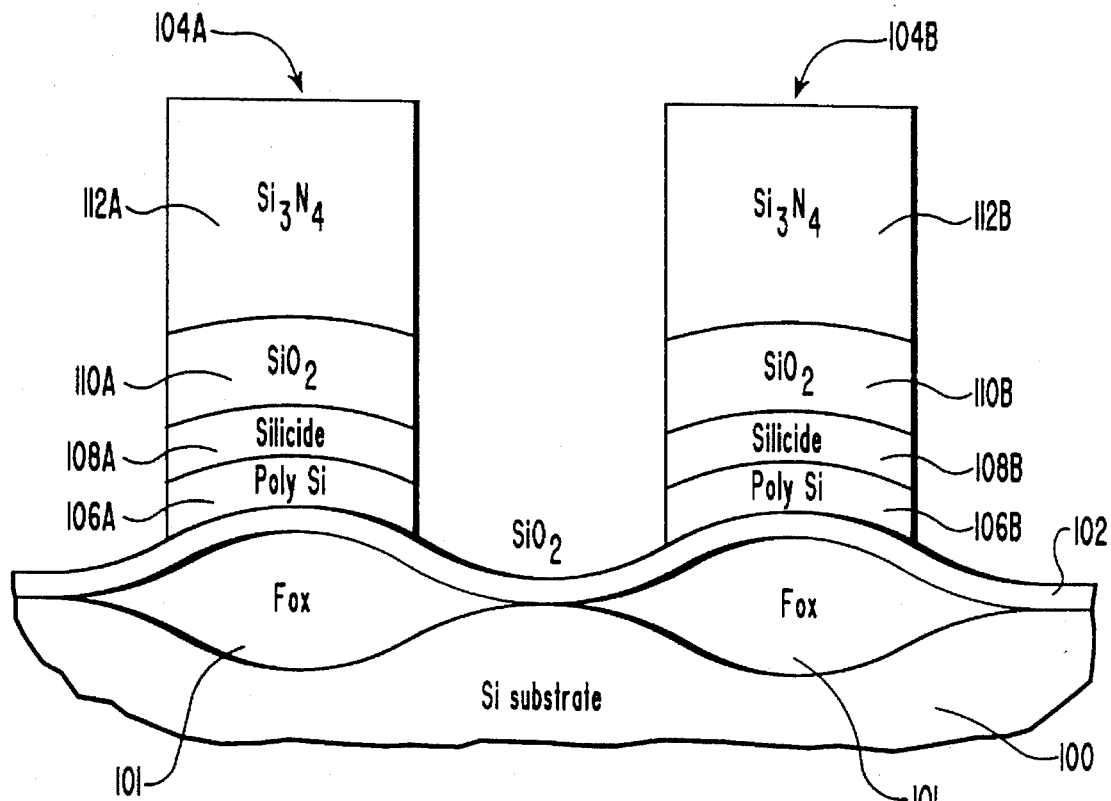
FIGS. 2A–2B represent the formation of two digit lines in accordance with the present invention.
Figure 2B:
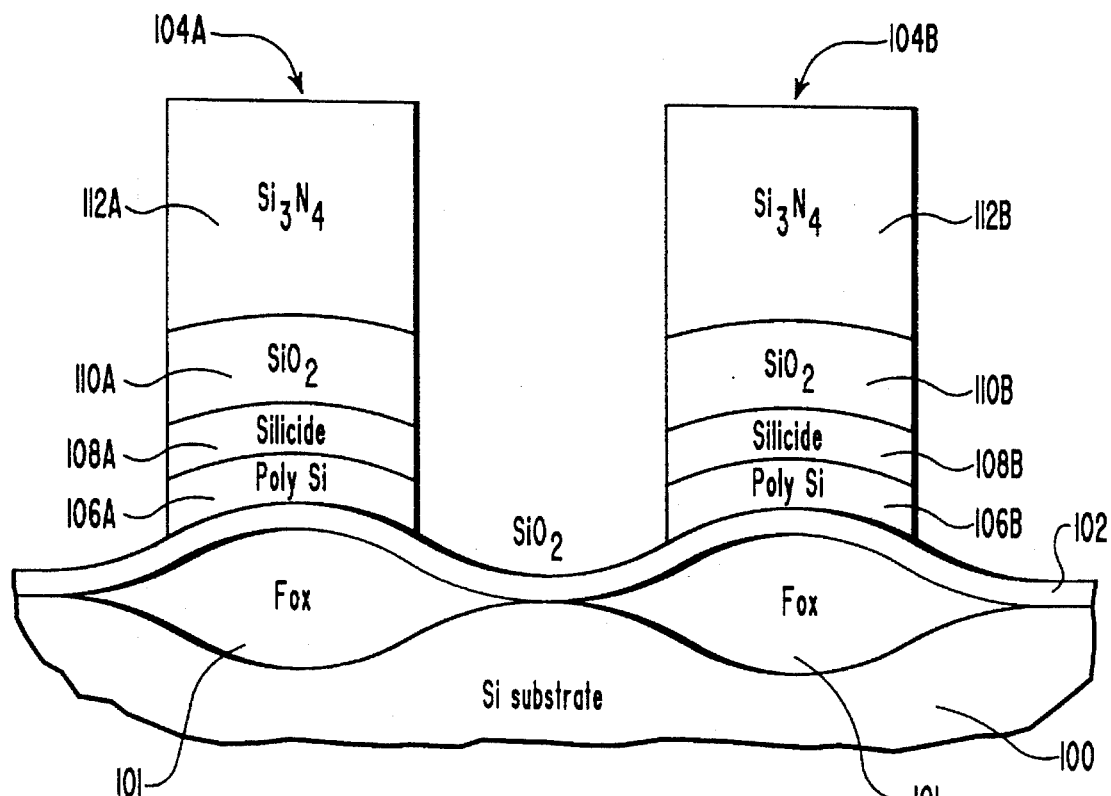

Referring now to FIGS. 2A and 2B, a silicon substrate 100 is represented. A silicon dioxide layer ($SiO_2$) 102 and a field oxide region (Fox) 101 are formed on the substrate 100. Field Oxide region 101 may be grown by conventional techniques known to the artisan. It will be appreciated that the herein described steps, materials, and structure comprise the presently preferred best known mode for carrying out the invention and other steps, materials, and structures, both those now known in the art and those to be developed in the future, may be used within the scope of the present invention. Also represented in FIGS. 2A–B are the digit lines 104A-B which are formed on the substrate 100. The digit lines 104A-B comprise polysilicon layers 106A-B (1000 Å to 3000 Å), silicide layers 108A-B (1000 Å to 2000 Å), and top insulating layers 110A-B (2000 Å to 5000 Å) which in the described embodiment are formed using silicon dioxide ($SiO_2$) as a dielectric.

Also provided in the embodiment illustrated in FIGS. 2A–B is a top layer 112A-B which will be removed later in the process as explained shortly. The top layers 112A-B may comprise a layer of $Si_3N_4$ (as represented in FIGS. 2–8) or may comprise other materials (such as silicon dioxide with appropriate changes in other materials) which can serve as a removable layer. Also, the silicide layer 108A-B can comprise $TiSi_2$ or other appropriate materials.

Figure 3A:
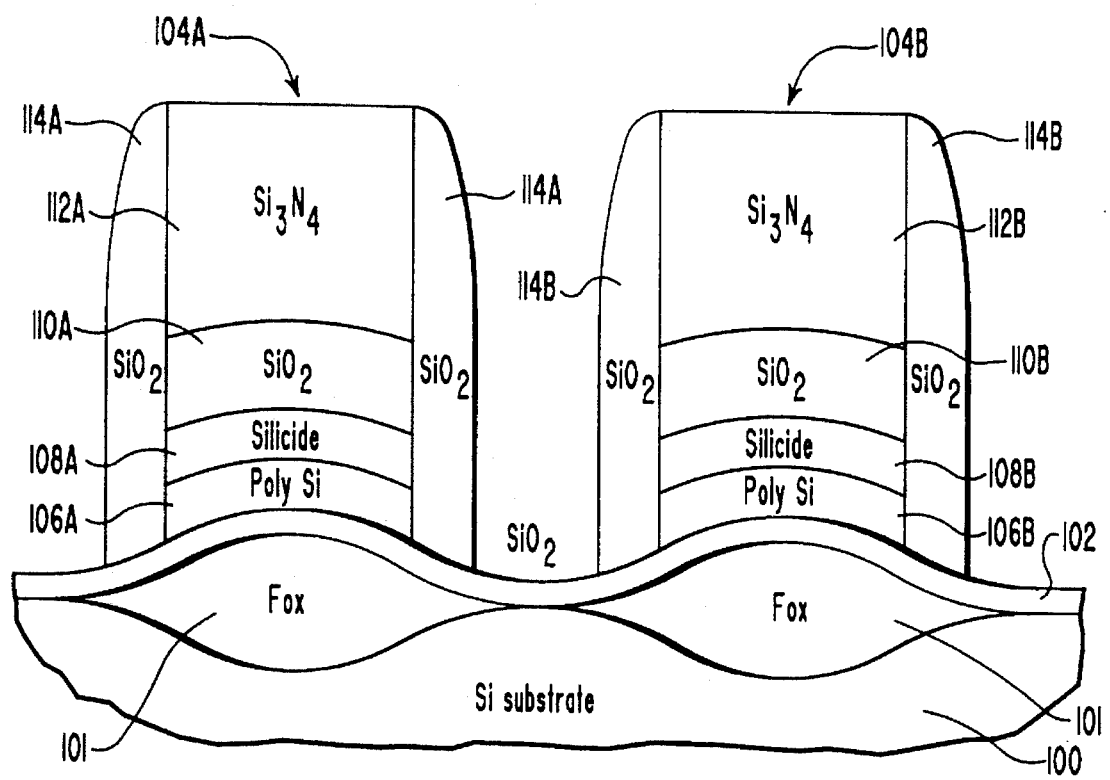
FIGS. 3A–3B represent the formation of digit line spacers for the M cell in accordance with the present invention.
Figure 3B:
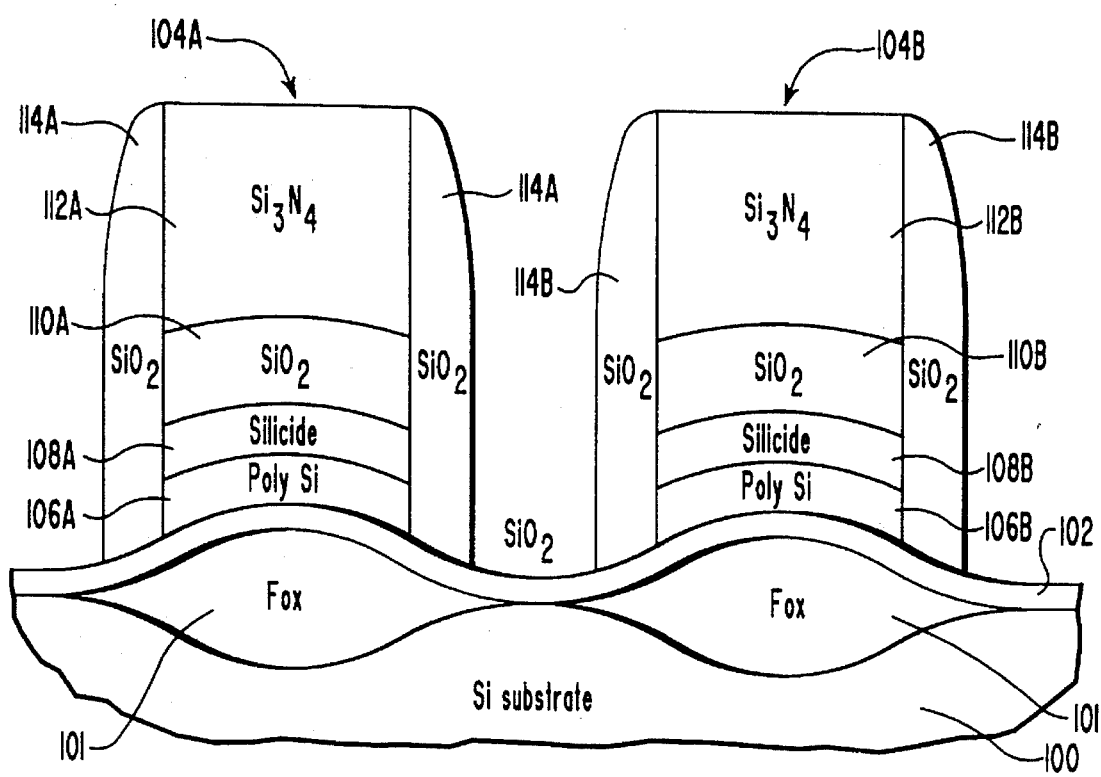

Referring next to FIGS. 3A–B, the digit line spacers 114A-B are formed. The described digit line spacers are one preferred example of a spacer means for supporting a subsequently formed layer. Other structures performing the same functions are to be considered equivalent to the spacers described in connection with the presently preferred embodiments of the invention.

As can be seen in FIGS. 3A–B, the digit line spacers 114A-B are preferably elongated protrusions extending substantially perpendicularly from the plane of substrate 100. The shape of the digit line spacers 114A-B may be shaped differently than that shown in the figures according to the particular processing techniques used and/or the characteristics of the cell which are desired. At least half of the spacer sides should be oriented at an angle greater than 45° and most preferably in the range from 75° to substantially perpendicular to the plane of the substrate 100.

Also, it is generally preferred that the height of the spacers 114 be at least two times as great as the width of the spacer at its base. As will be appreciated after consideration of this disclosure, in many cases it is desirable to maintain the spacer sides as substantially vertical as possible so that the surface area of the sides of the spacers 114 is maximized. As used herein, the terms "vertical" and "horizontal" are to be taken in relation to the plane of the substrate 100. Furthermore, it should be appreciated that the structures of the present invention may be fabricated such that many layers of material are interposed between the substrate 100 and the capacitor structures.

The digit line spacers 114A-B are preferably formed by silicon dioxide deposition followed by a dry etch step. Silicon dioxide is preferred but other materials may also be used. For example, if the digit line spacers 114A-B are formed using $SiO_2$ the top layers 112A-B can be desirably formed using $Si_3N_4$ and vice versa.

Figure 4A:
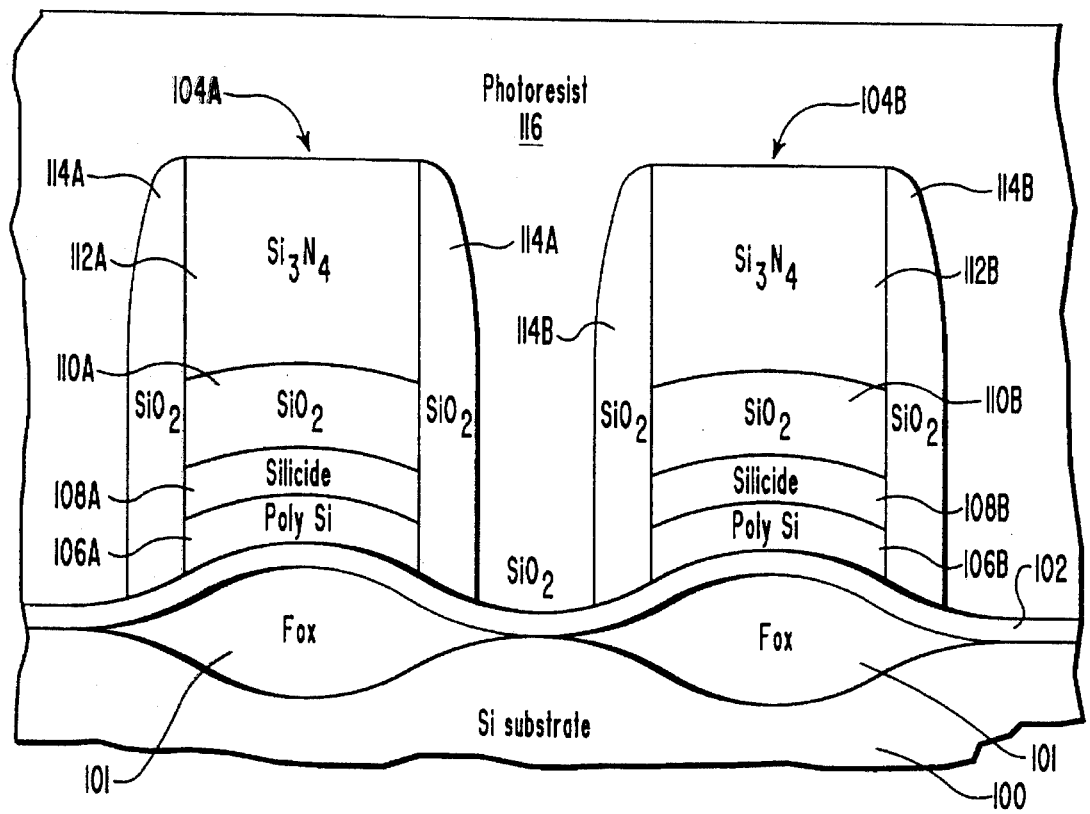
FIGS. 4A–4B represent the patterning of a photoresist layer prior to formation of the M memory cell storage node contact.
Figure 4B:
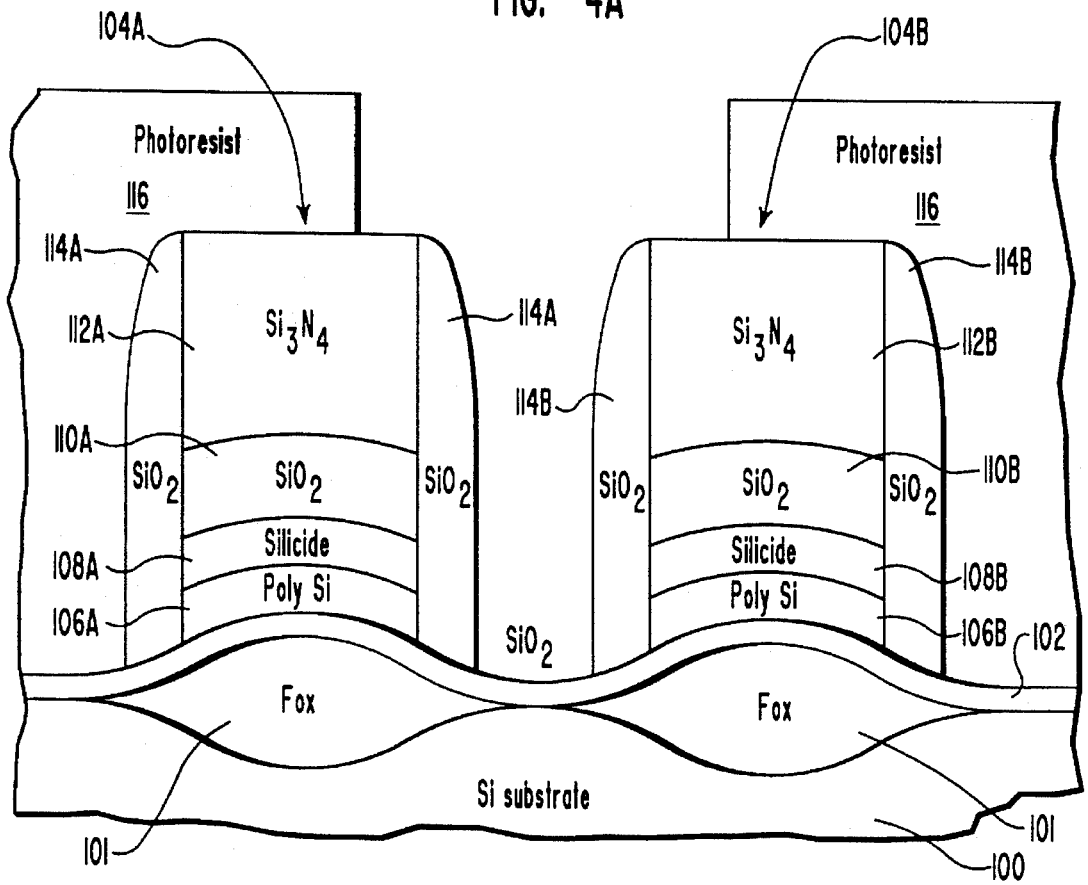

FIGS. 4A–B represent a step directed to the creation of a storage node contact, i.e., the contact between the bottom plate of the storage capacitor and the appropriate active region of the silicon substrate 100. Represented in FIGS. 4A–B is a photoresist layer 116 which is applied and then patterned. In FIG. 4A, no patterning of the photoresist layer 116 is evident but in FIG. 4B, showing a view taken through the storage node contact as represented in FIG. 1, the patterning of the photoresist layer is evident, and the storage node contact is shown to overlap digit line 104A, illustrating the self-aligned nature of this process.

Figure 5A:
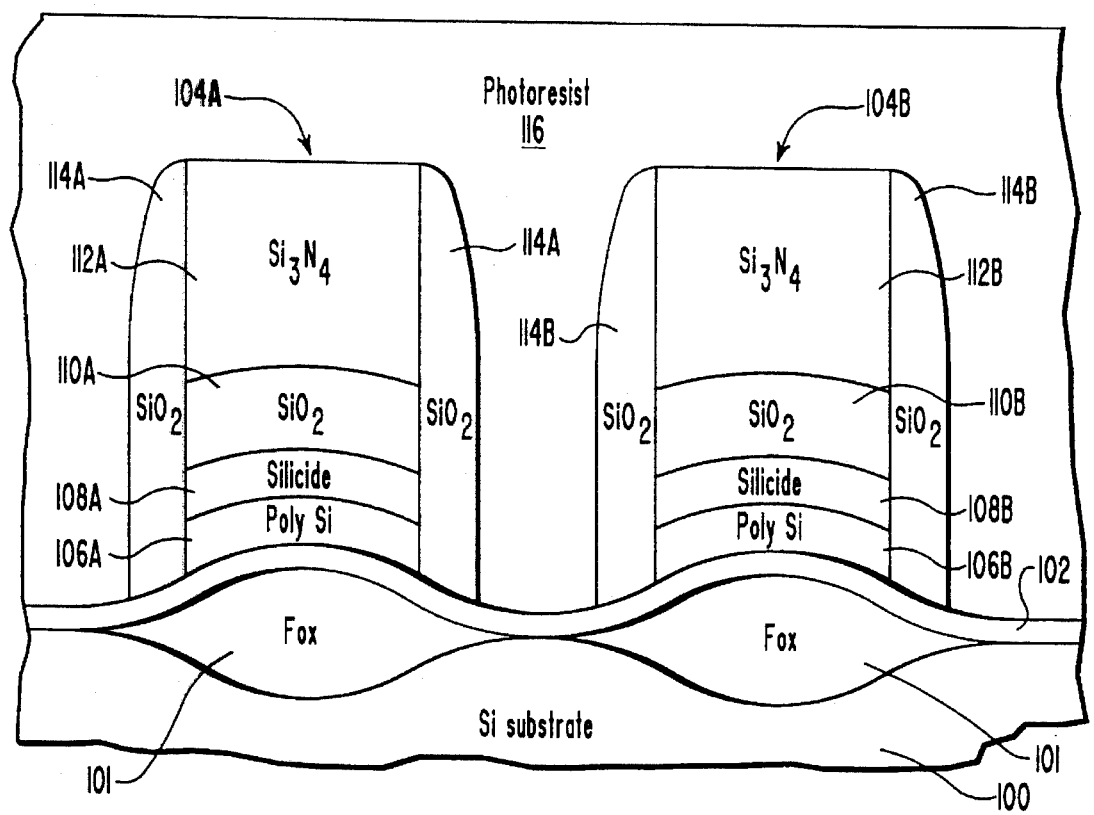
FIGS. 5A–5B represent the formation of the M memory cell storage node contact (shown in FIG. 5B).
Figure 5B:
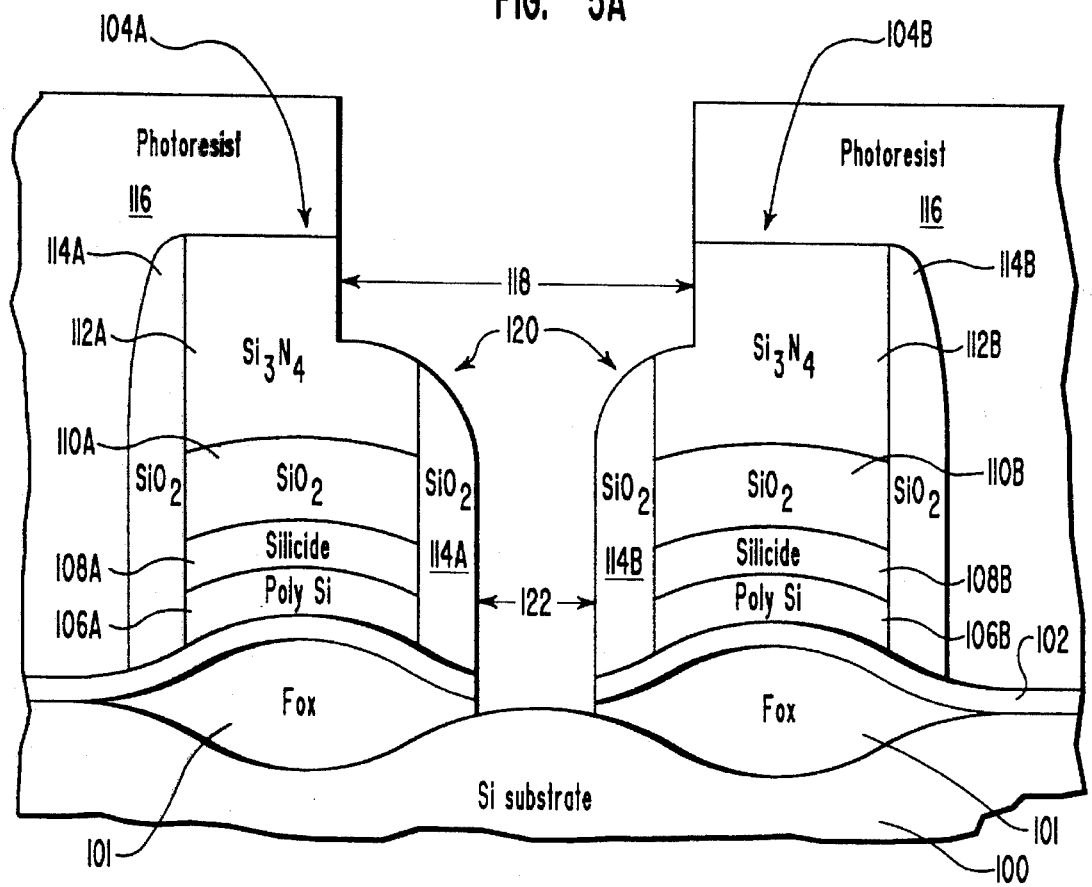

FIGS. 5A–B will be referred to next. After the photoresist layer 116 has been patterned, a storage node contact opening, indicated by arrows 122, in the silicon dioxide layer 102 is formed by a dry oxide etch procedure. The opening 122 provides for the formation of the storage node contact with the substrate 100. The etching of the storage node contact opening 122 may be carried out using an isotropic dry etch followed by an anisotropic oxide etch to increase the overall storage node contact size. Alternatively, the etching of the storage node contact opening 122 may be carried out using a straight anisotropic oxide etch or other suitable techniques.

The use of the former technique will generally result in a larger overall storage node contact, i.e., a greater dimension at 118 and at 120. When a larger storage node contact is formed, some capacitance is lost but the larger storage node contact may result in a lower defect density.

Significantly, it will be appreciated that the storage node contact is self aligned with respect to both the word line and the digit line. This characteristic of the present invention is a great advance over other structures which seek to increase cell capacitance through the use of three dimensional schemes.

Figure 6A:
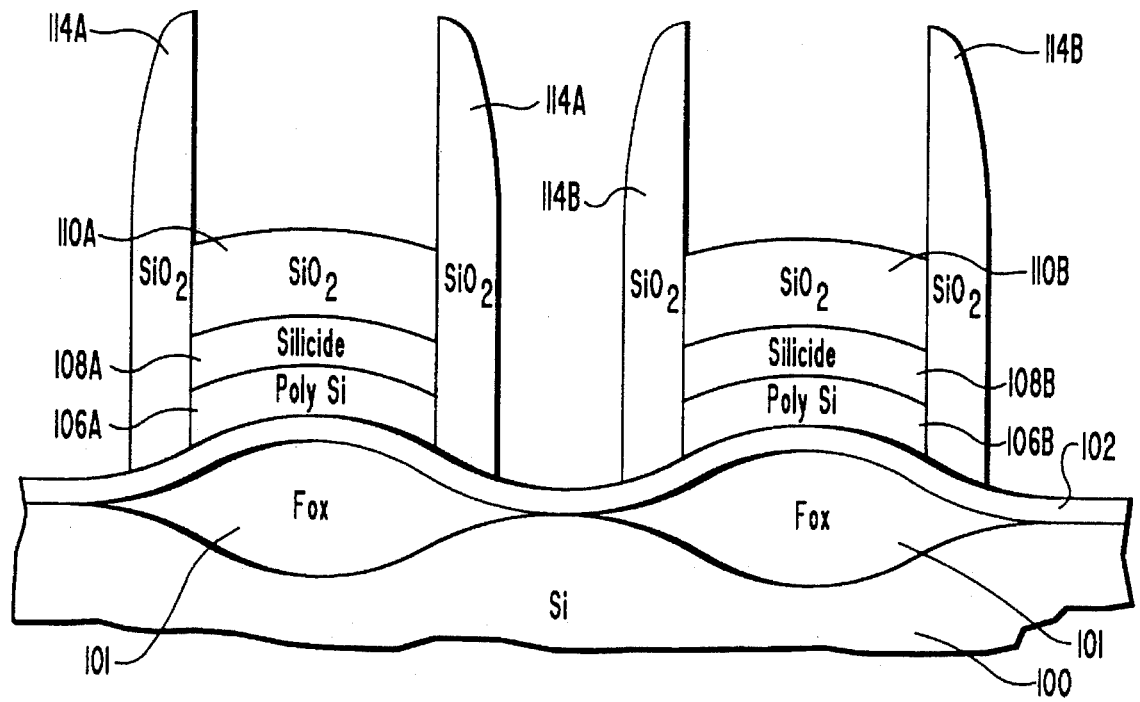
FIGS. 6A–6B represent the removal of the top disposable layer of the digit lines.
Figure 6B:
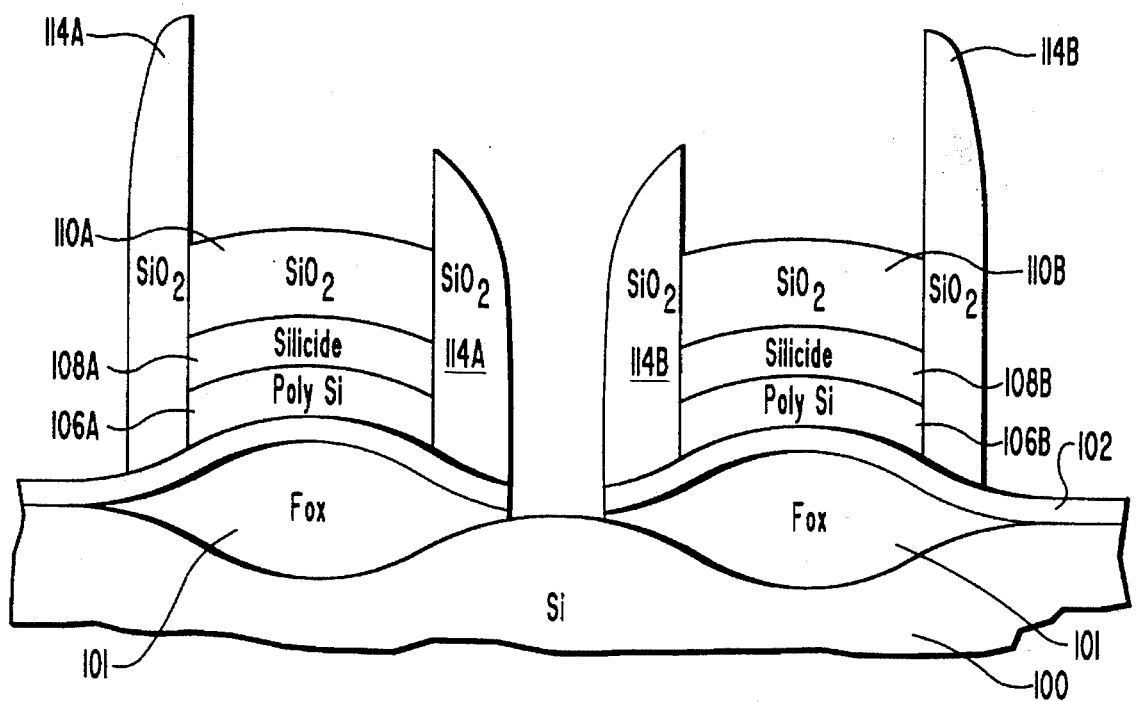

FIGS. 6A–B represent the structures of the M cell embodiment after removal of the photoresist layer 116 and the removal of the top layers 112A-B from the digit lines 104A-B. The top layers 112A-B (comprising $Si_3N_4$ in the represented embodiment) are preferably removed by a selective wet nitride etch which will not attack either the exposed silicon or silicon dioxide.

Figure 7B:
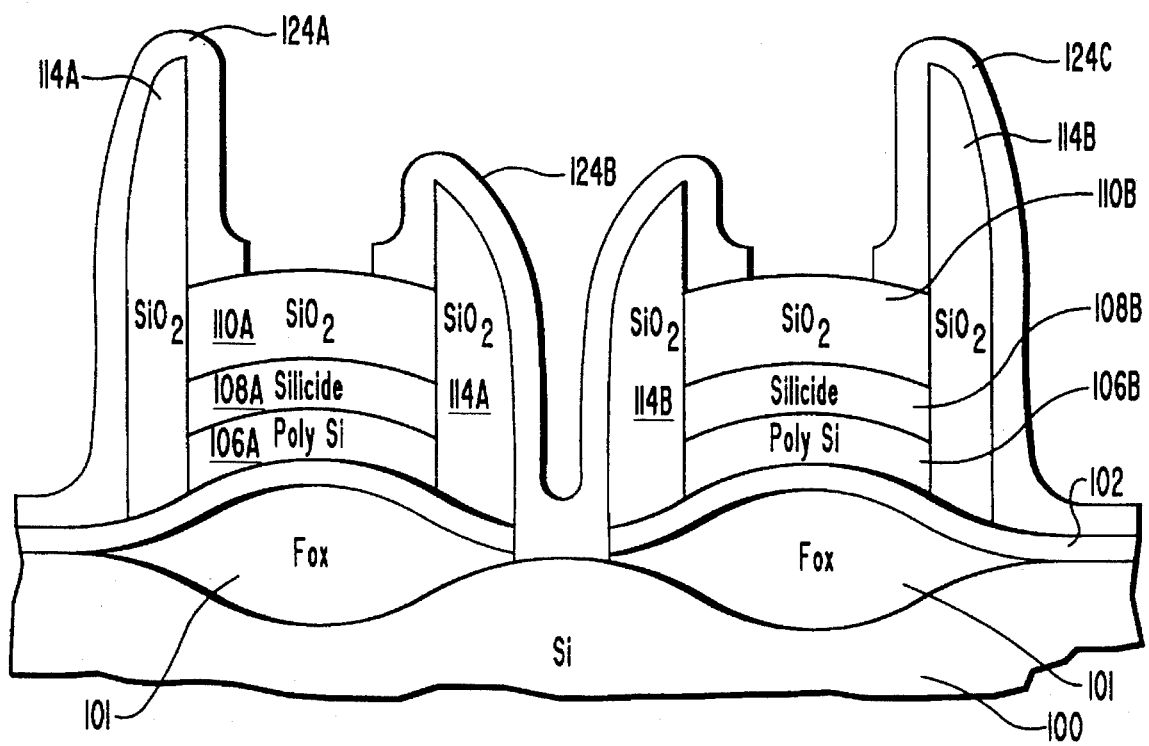

FIGS. 7A–B illustrate the addition of cell storage node layers 124A-C which function as the capacitor bottom plate for the cells. The contact between the storage node layer 124B and the substrate 100 can be seen in FIG. 7B. The storage node layers 124A-C in the described embodiments are conductive layers which preferably comprise polysilicon. The polysilicon is preferably deposited to about 5000 Å to about 3000 Å thick and is patterned and etched to form the isolated storage nodes (capacitors) for each of the memory cells.

Figure 8A:
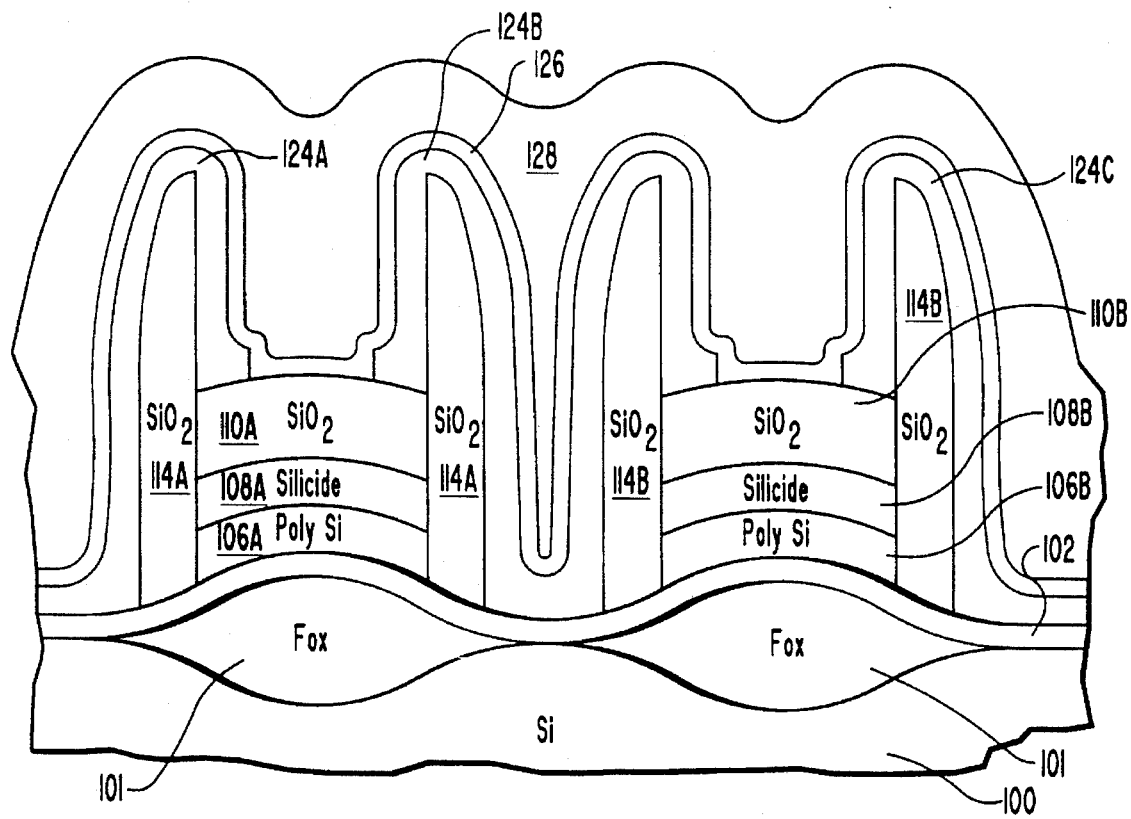
FIGS. 8A–8B represent the formation of the M memory cell dielectric layer and the capacitor top plate.
Figure 8B:
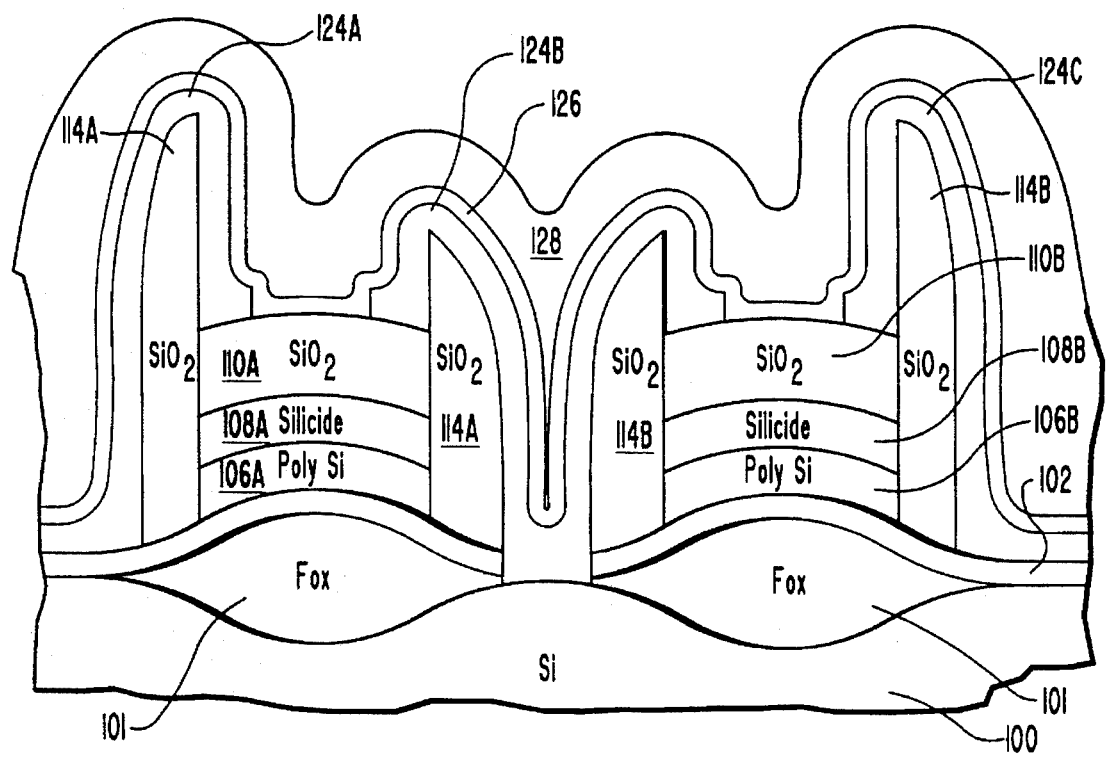

Referring next to FIGS. 8A–B, after the formation of the cell node, e.g., 124B, a thin storage dielectric layer 126 is deposited. It will be appreciated that a thinner storage dielectric layer 126 is desirable but that as the storage dielectric layer 126 becomes too thin, the number of defects which occurs becomes unacceptable. In the illustrated embodiments, the storage dielectric layer 126 is about 50 Å to about 100 Å thick and is comprised of $Si_3N_4$. The $Si_3N_4$ storage dielectric layer is generally reoxidized to remove defects.

Still referring to FIGS. 8A–B, another conductive layer, preferably a polysilicon top plate 128 (which is common to all of the memory cells) is deposited on the underlying structures. This polysilicon top plate 128 is generally about 2000 Å to about 4000 Å thick.

Viewing FIGS. 8A–B, it can be appreciated that the capacitor bottom plate, e.g., 124B, resembles an "M" when viewed in cross section. Thus, the term "M cell" has been adopted to refer to the structure represented in FIGS. 1–8. Most importantly, the square area of the storage node layer 124B, or capacitor bottom plate, has greatly increased over flat capacitor structures occupying the same planar area. Moreover, the present invention provides a reliably fabricated structure having a fully self aligned storage node contact.

The Wave cell embodiment of the present invention will be described next. The Wave cell embodiment can provide even greater charge storage capacity than the previously described M cell embodiment while retaining the same advantages over the previously available art.

Figure 9:
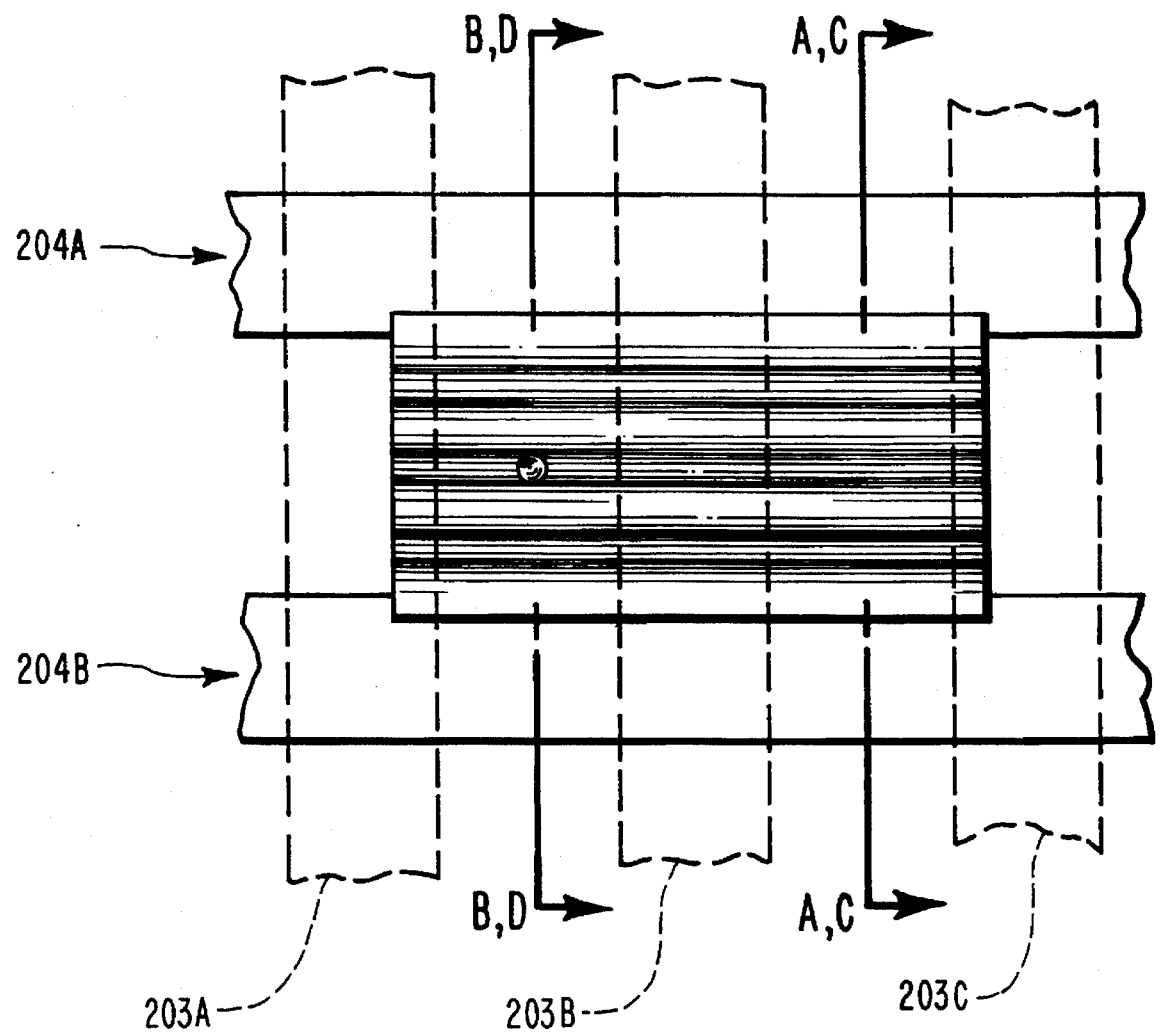
FIG. 9 is a top view of a partially completed Wave memory cell, or Wave cell, of the present invention wherein section lines A—A and C—C represents the views of FIGS. 10A–16A and 10C–16C, and wherein section lines B—B and D—D (taken through the storage node contact) represent the view of FIGS. 10B–16B and 10D–16D.

In FIG. 9, section lines A—A and C—C represent the view from which FIGS. 10A–16A and 10C–16C are taken. Section lines B—B and D—D represent the view from which FIGS. 10B 16B and 10D–16D are taken. Views taken through line B—B or D—D show the topology at the memory cell storage node contact. In FIG. 9, as in FIG. 1, three word lines 203A-C (shown in phantom) and two digit lines 204A-B are diagrammatically represented. It will be appreciated that the memory cell capacitors of the Wave cell can be "stacked upon" each other as described earlier. For increased clarity, FIG. 9 only shows one capacitor structure.

As described in connection with the M cell embodiment, the steps of defining the field areas and active areas on the substrate, covering the active areas with a gate oxide, the formation of word lines, the formation of word line spacers, the formation of the source and drain regions, and the deposition of an oxide layer and the formation of contacts for the digit lines are carried out using conventional fabrication steps.

Figure 10A:
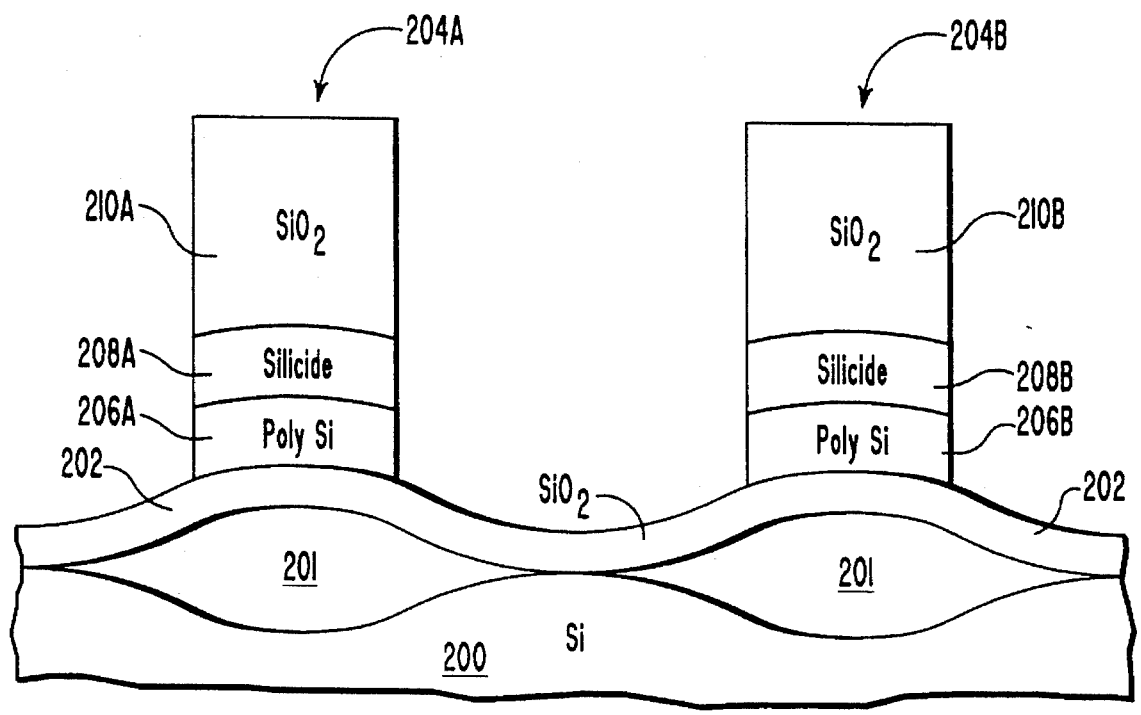
FIGS. 10A–10B represent the formation of two digit lines in accordance with the present invention.
Figure 10B:
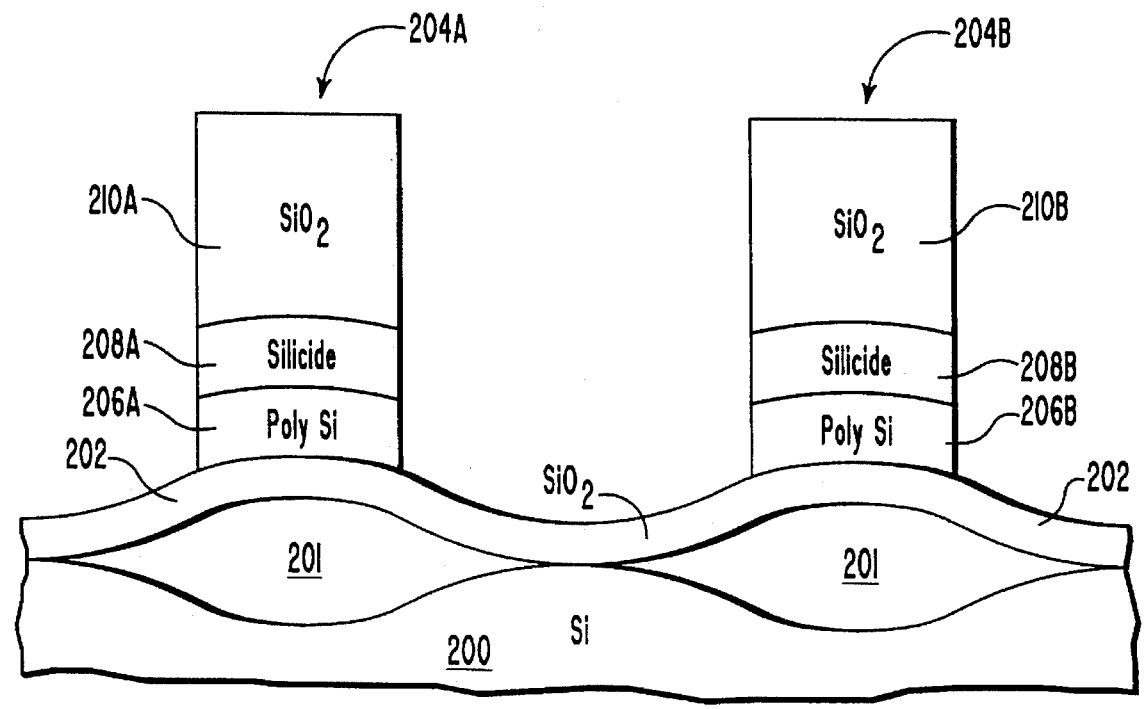

Referring now to FIGS. 10A and 10B, a silicon substrate 200 is represented. A field oxide region 201, which may be conventionally grown, is also shown. A silicon dioxide layer ($SiO_2$) 202 is also formed on substrate 200. Also represented in FIGS. 10A–B are digit lines 204A-B which are formed on the substrate 200. The digit lines 204A-B comprise polysilicon layers 206A-B (1000 Å to 3000 Å), silicide layers 208A-B (1000 Å to 2000 Å), and top insulating layers 210A-B (2000 Å to 5000 Å).

Figure 11A:
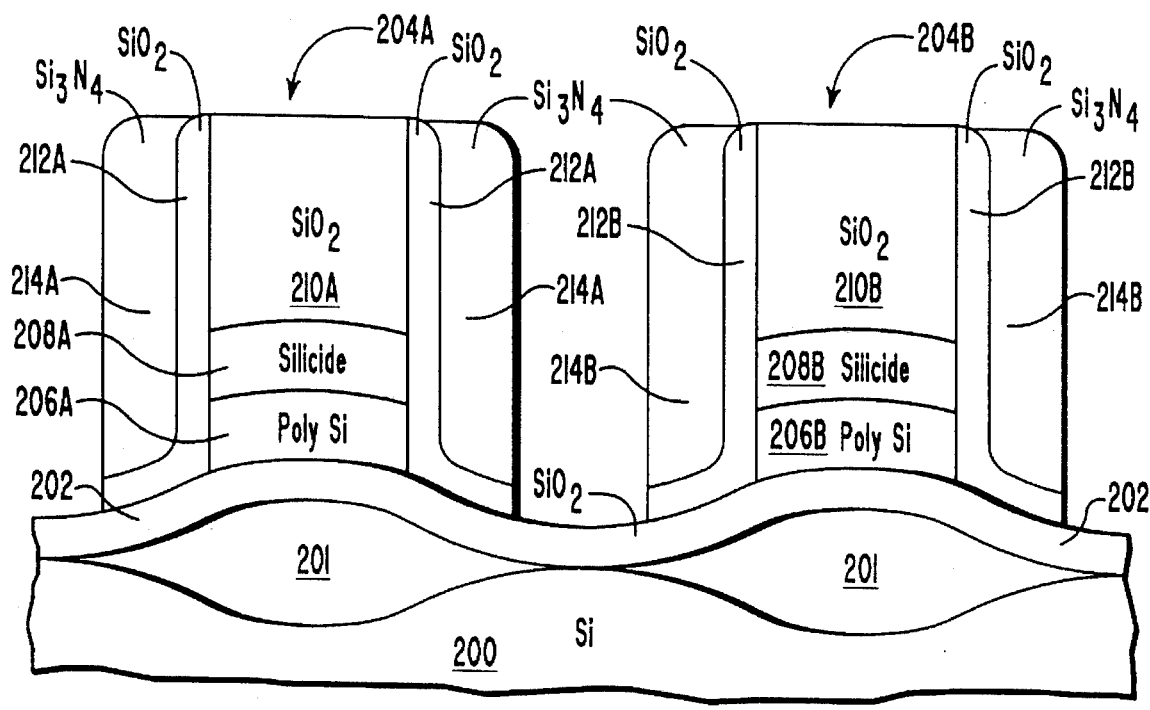
FIGS. 11A–11B represent the formation of digit line composite spacers for the Wave cell in accordance with the present invention.
Figure 11B:
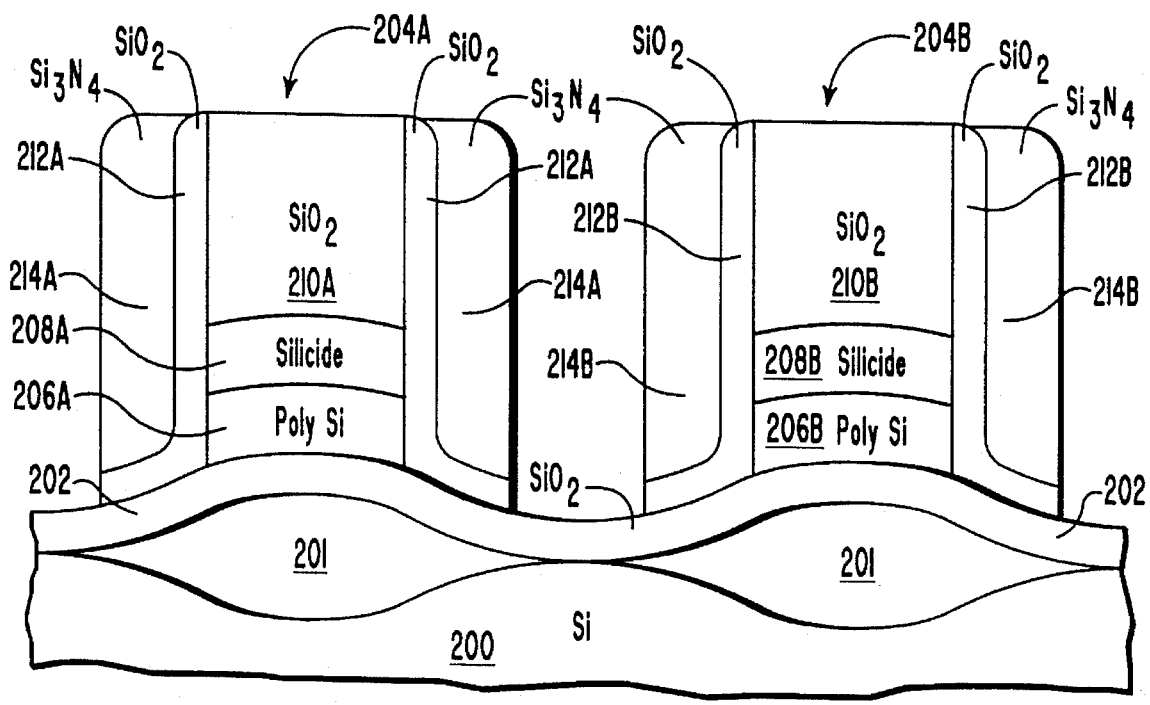
Figure 11C:
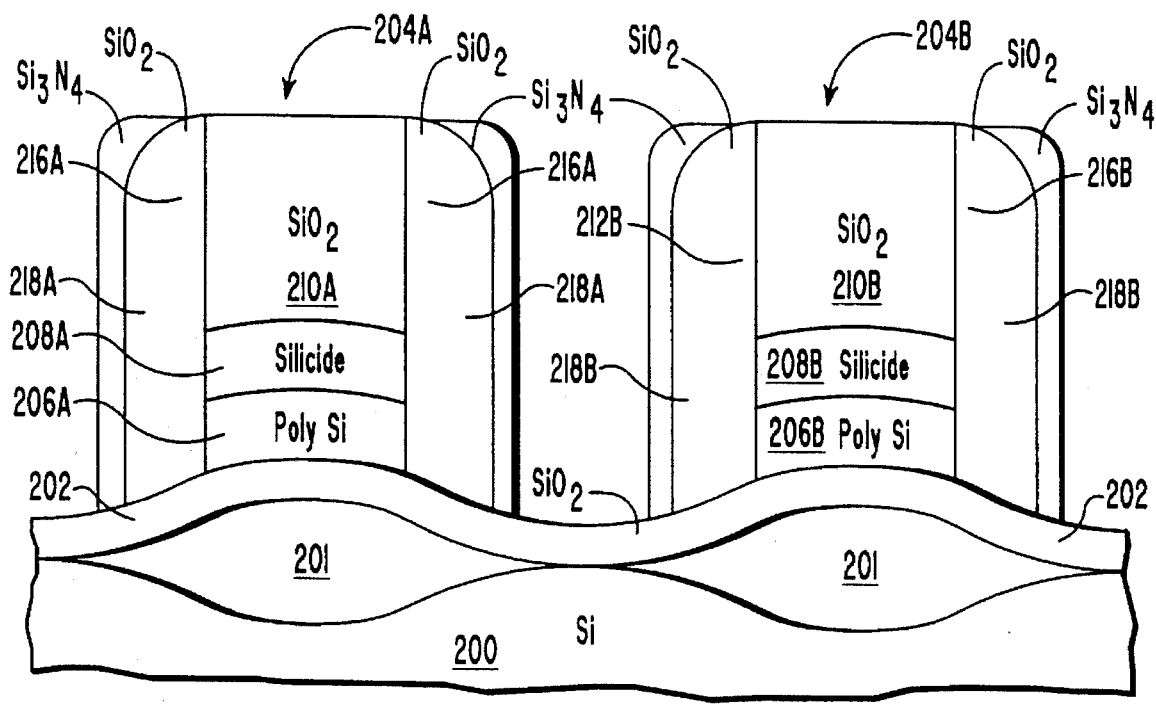
FIGS. 11C–11D represent the formation of Wave memory cell digit line composite spacers in accordance with the present invention.
Figure 11D:
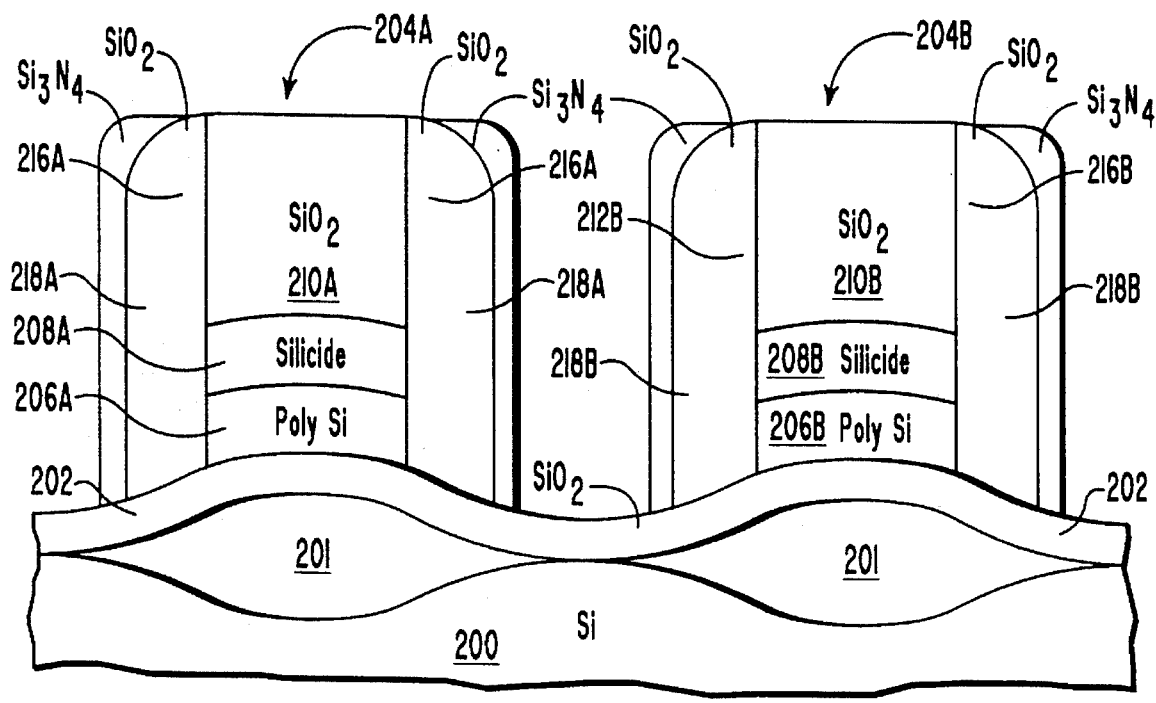

The formation of the first digit line spacers are represented in FIGS. 11A–B. The first digit line spacers are composite structures formed by creating a $SiO_2$ spacer component 212A-B and a $Si_3N_4$ spacer component 214A-B. The $Si_3N_4$ spacer component 214A-B will be removed later in the process to leave the $SiO_2$ spacer component 212A-B exposed. The $SiO_2$ spacer component 212A-B is another example of the spacer means of the present invention. FIGS. 11C–D illustrate another composite structure which can be used to form the first digit line spacers.

Illustrated in FIGS. 11C–D is another structure for the formation of the first digit line spacers and represents another example of the spacer means of the present invention. Represented in FIGS. 11C–D are a $SiO_2$ spacer component 216A-B which is deposited and then etched and a $Si_3N_4$ spacer component 218A-B which is also deposited and then etched. The $Si_3N_4$ spacer component 218A-B will later be removed. The structures represented in FIGS. 11C–D may be used in the subsequent steps if desired.

Figure 12A:
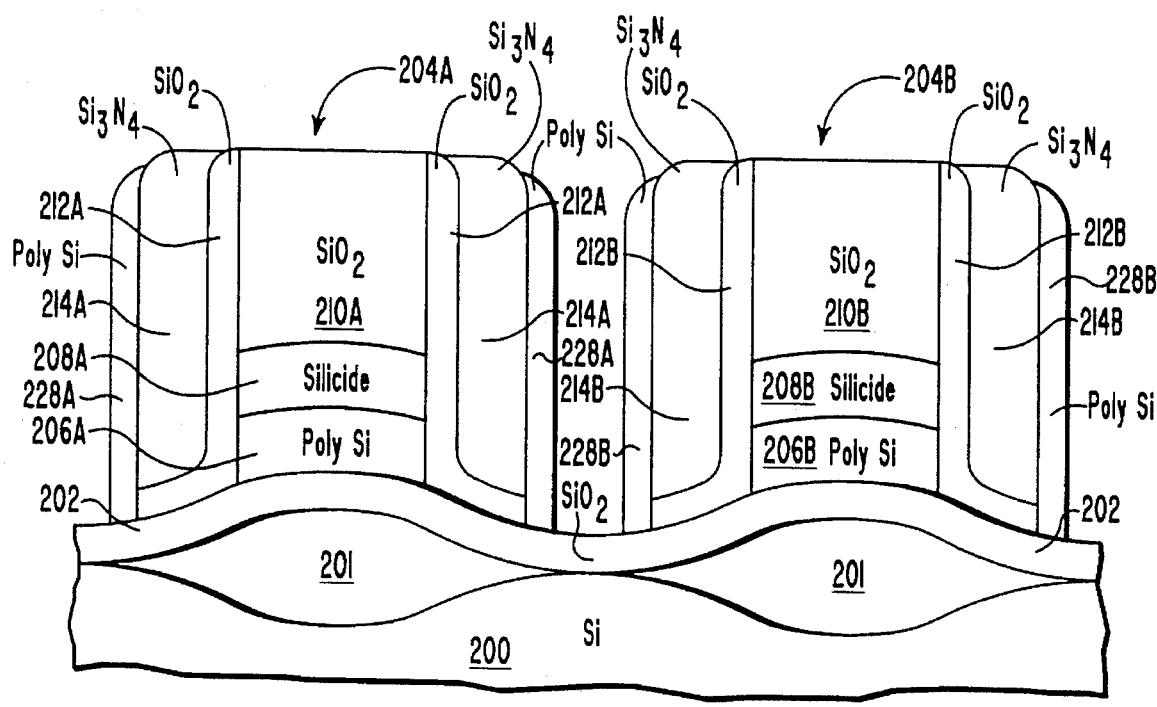
FIGS. 12A–12B represent the formation of additional Wave memory cell digit line spacers.
Figure 12B:
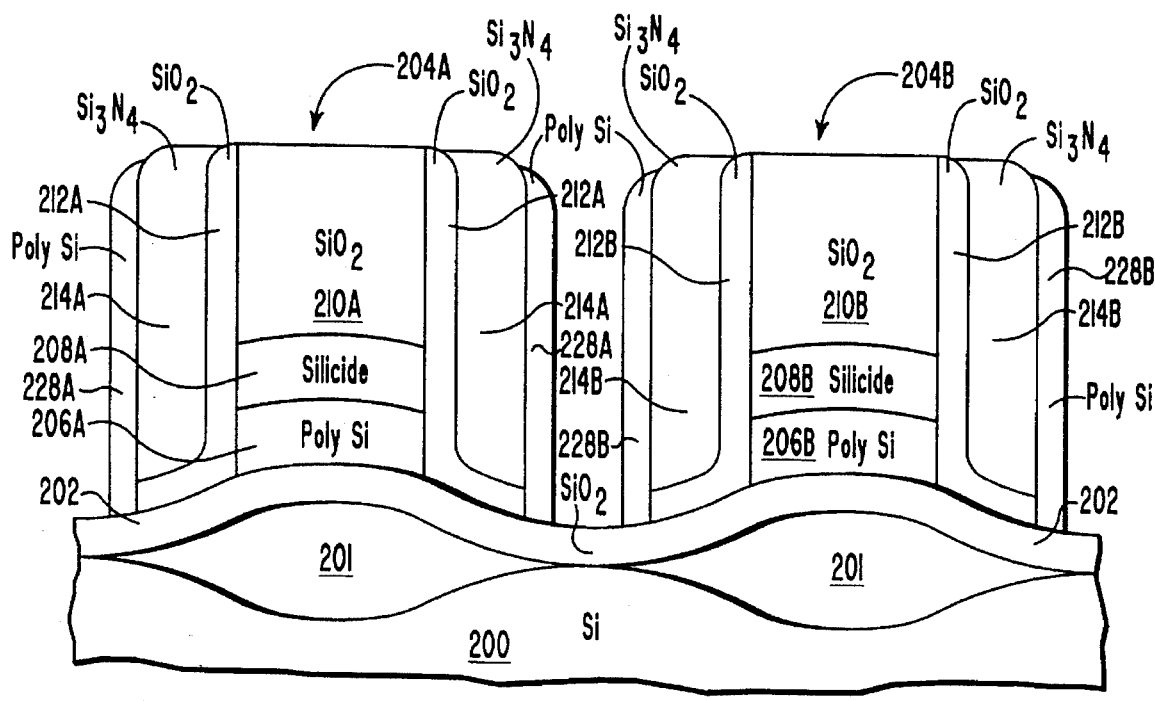

FIGS. 12A–B represent the formation of second digit line spacers 228A-B. The second digit line spacers 228A-B are another example of a spacer means in accordance with the present invention.

Figure 13A:
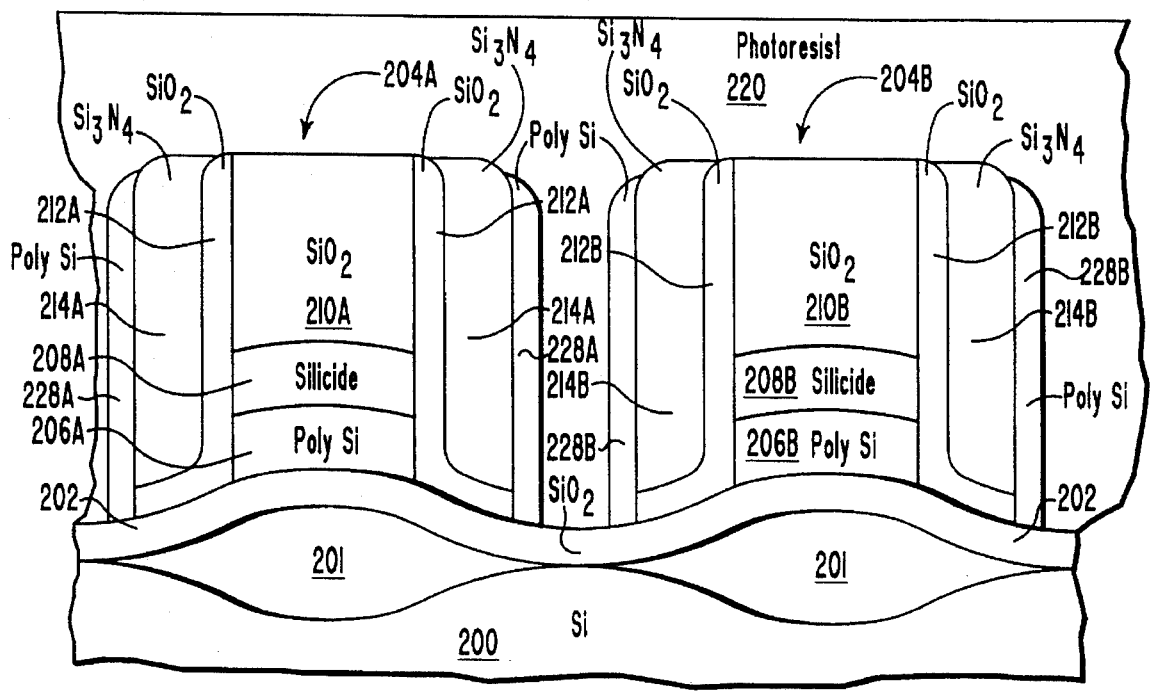
FIGS. 13A–13B represent the patterning of a photoresist layer prior to formation of the Wave memory cell storage node contact (FIG. 13B).
Figure 13B:
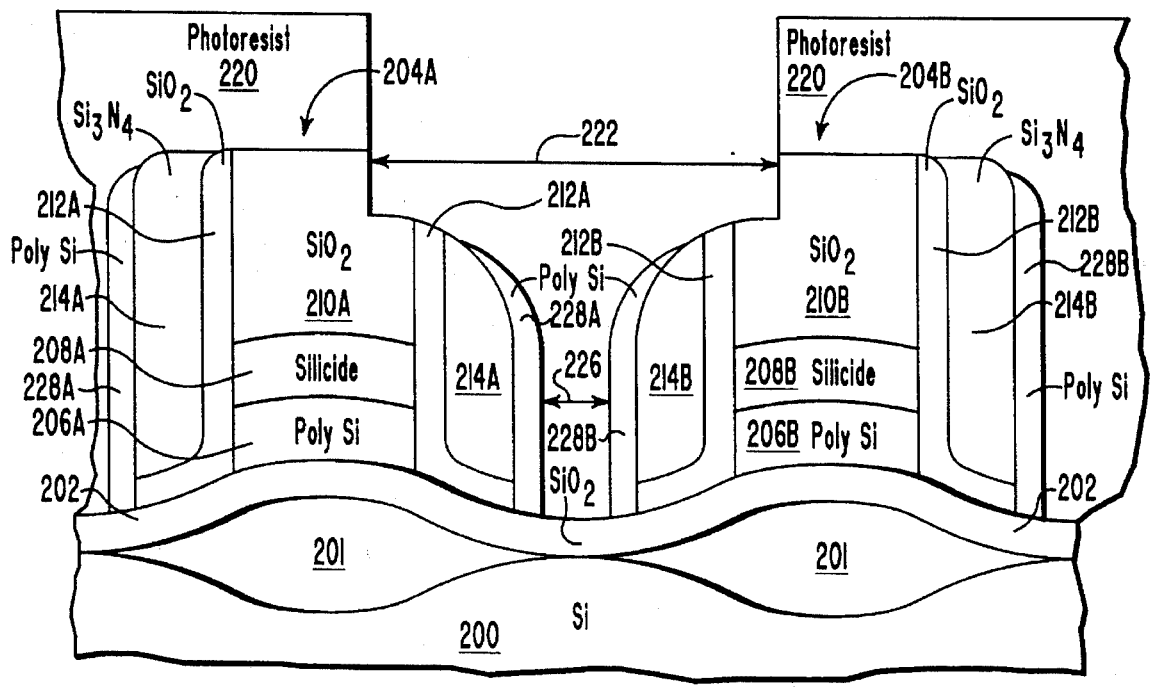

FIGS. 13A–B represent a step taken to create a storage node contact, i.e., the contact between the bottom plate of the storage capacitor and the appropriate active region of the silicon substrate 200. Represented in FIGS. 13A–B is a photoresist layer 220 which is applied and then patterned. In FIG. 13A, no patterning of the photoresist layer 220 is evident but in FIG. 13B, showing a section through the storage node contact as represented in FIG. 9, the patterning of the photoresist layer is evident.

Still referring to FIGS. 13A–B, after the photoresist layer 220 has been patterned, a storage node contact opening, indicated by arrows 226, in the silicon dioxide layer 202 is formed by an etching process. The opening 226 provides for the formation of the storage node contact with the substrate 200. As explained in connection with the M cell embodiment, the etching of the storage node contact opening 226 may be carried out using an isotropic dry etch followed by an anisotropic oxide etch to increase the overall storage node contact size. Alternatively, the etching of the storage node contact opening 226 may be carried out using a straight anisotropic oxide etch or some other suitable technique.

Significantly, it will be appreciated that in the Wave cell embodiment, as in the M cell embodiment, the storage node contact is self aligning with respect to both the word line and the digit line. This characteristic of the present invention is a great advantage over other structures which seek to increase cell capacitance through the use of three dimensional schemes.

In the described structure, the second digit line spacers 228A-B comprise polysilicon. Since polysilicon is a relatively good conductive material, forming the second digit line spacers 228A-B out of polysilicon provides both physical support for storage node layers 232A-C to be formed later (see FIGS. 15A–B) but also reduce the electrical resistance of the polysilicon storage node layers. Other materials could be used within the scope of the present invention.

Figure 13C:
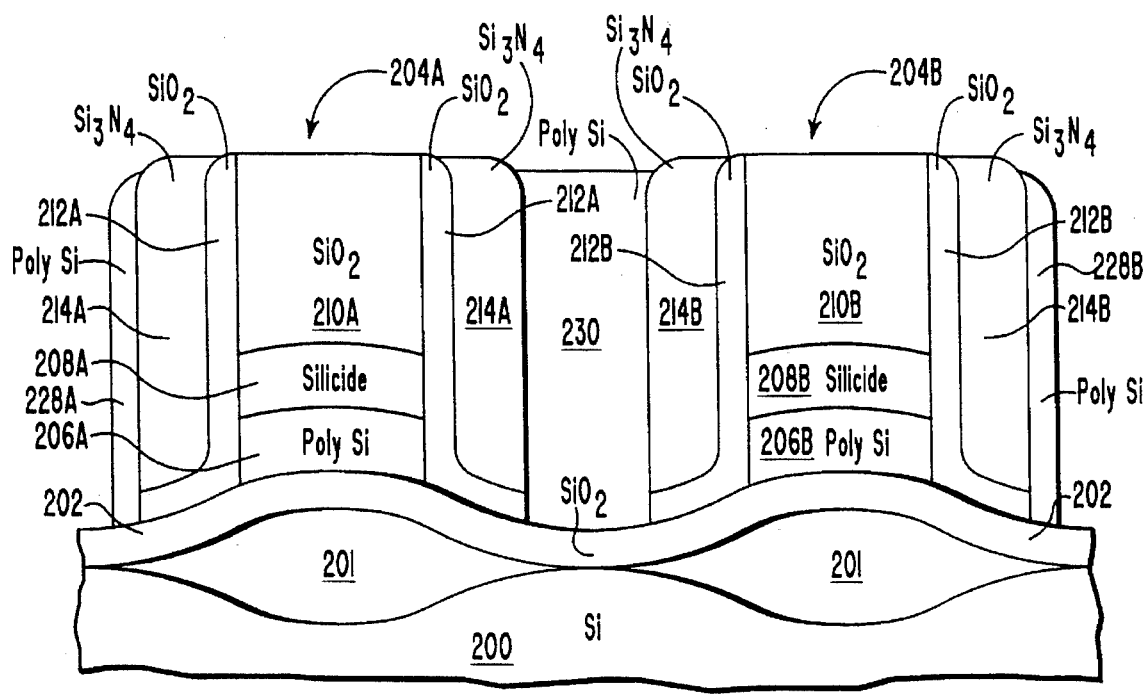
FIGS. 13C–13D represent the formation of a digit line plug spacer to create a Half-Wave cell as an alternative to the formation of digit line spacers represented in FIGS. 13A–13B.
Figure 13D:
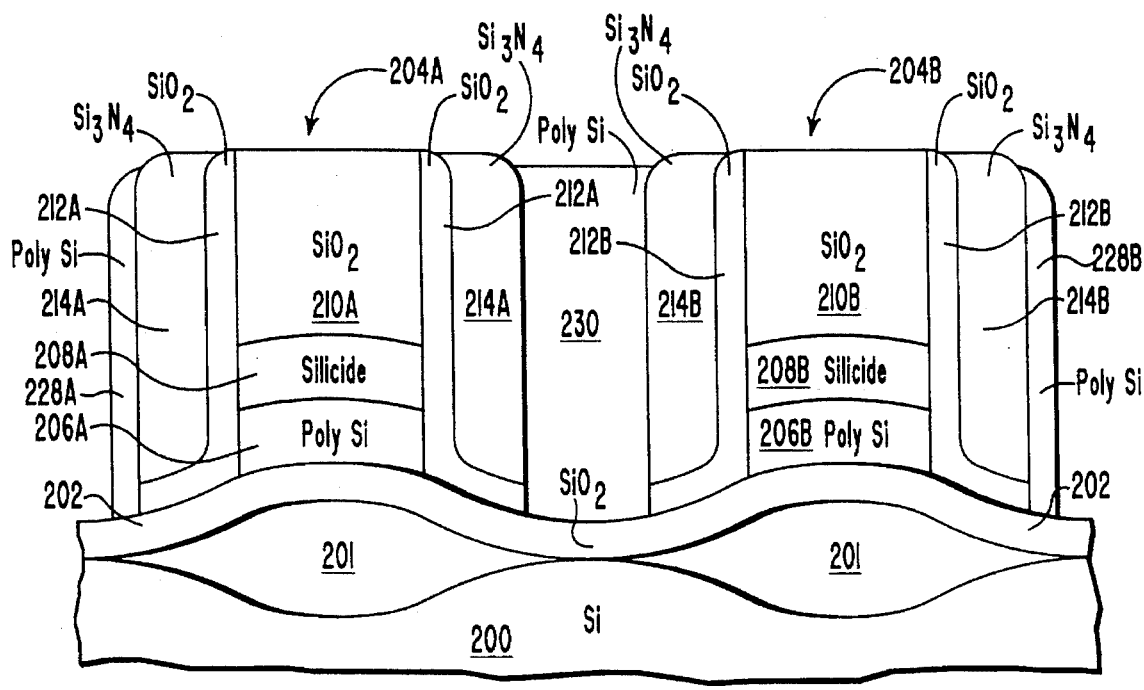

FIGS. 13C–D illustrate the formation of a plug spacer 230. The plug spacer 230 is formed if the thickness of the second digit line spacers 228A-B and 228A-B is great enough and/or the distance between adjacent digit lines is small enough to cause the second digit line spacers to merge into one structure. The plug spacer 230 is another preferred example of a spacer means in accordance with the present invention and may also be formed in ways other than those explicitly described herein.

The inclusion of the plug spacer 230, which in the illustrated embodiment is comprised of polysilicon, results in a completed structure which is referred to as a half-wave cell due to its resemblance to a half wave when viewed in cross section. The formation of the completed half-wave cell will be understood when the remaining steps, represented in FIGS. 14–16, are considered and thus need not be further explained at this point.

Figure 14A:
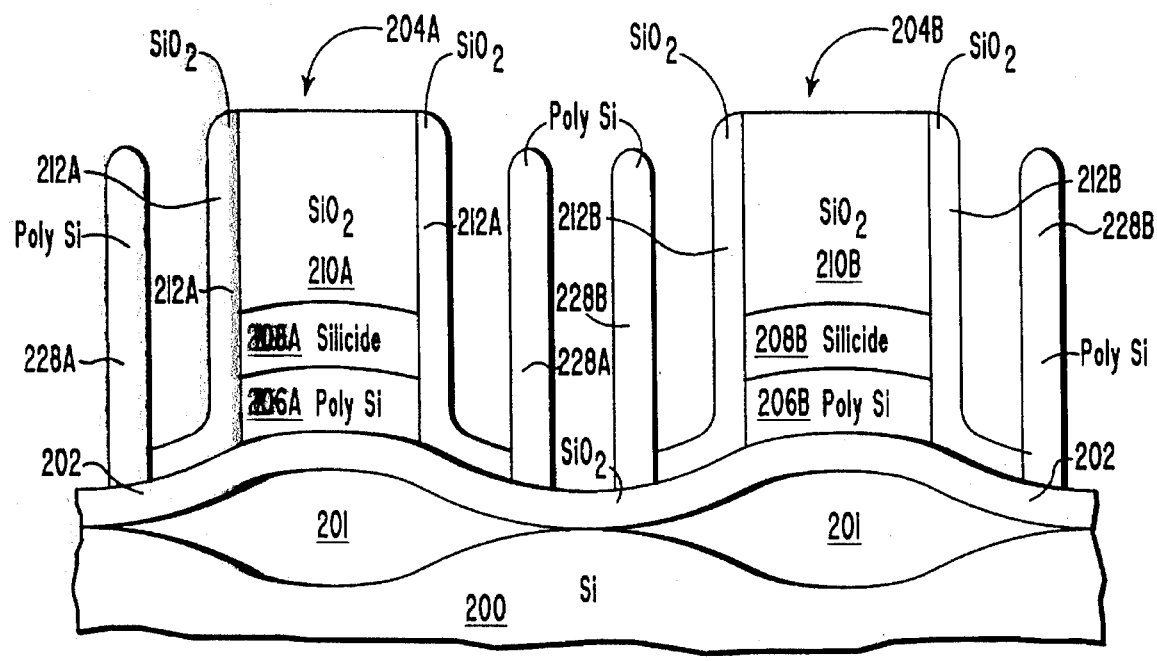
FIGS. 14A–14B represent the removal of a portion of the Wave memory cell digit line composite spacers.
Figure 14B:
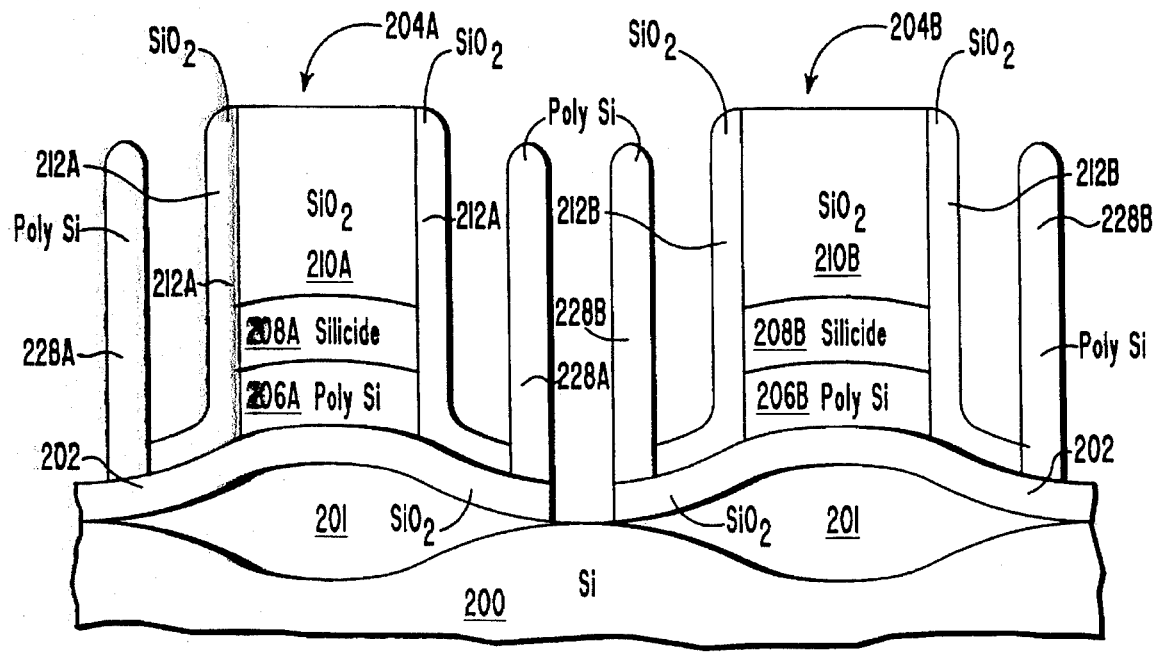

FIGS. 14A–B represent the removal of the $Si_3N_4$ spacer component 214A-B of the first digit line spacers. The removal of the $Si_3N_4$ spacer component 214A-B of the first digit line spacers leave the second digit line spacers 228A-B as free standing structures. The foot of the $SiO_2$ spacer component 214A-B of the first digit line spacer is desirably formed so that it contacts the base of the second digit line spacers 228A-B to lend support thereto.

It will be appreciated that it is within the scope of the present invention to add additional spacers if desired. For example, fifth and sixth spacers could be added to the structure of the Wave cell.

Figure 15B:
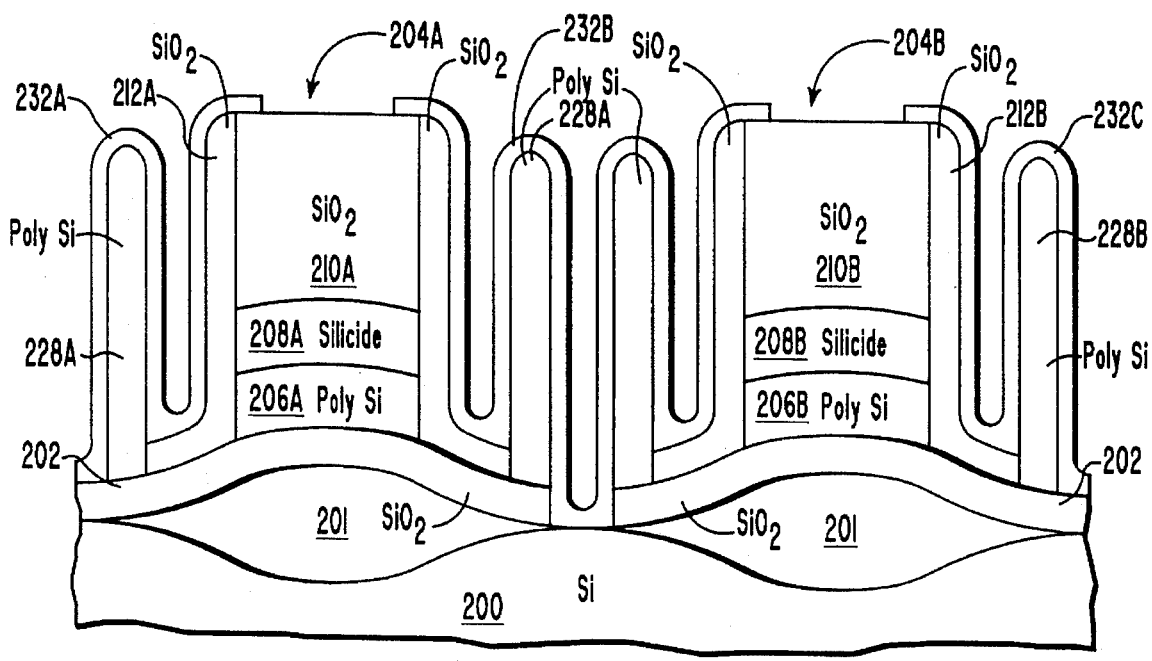

FIGS. 15A–B illustrate the addition of cell node layers 232A-C which function as the capacitor bottom plate for the cells. As can be seen in FIGS. 15A–B, the cell node layers 232A-C are formed over the top side of each spacer and also over at least one side of the substantially vertical sides of the spacers. The contact between the node layer 232B and the substrate 120 can be seen in FIG. 15B. The node layers 232A-C in the described embodiments preferably comprise polysilicon which is deposited from about 500 Å to about 3000 Å thick and which is patterned and etched to form the isolated storage nodes (capacitors) for each of the memory cells.

Figure 16A:
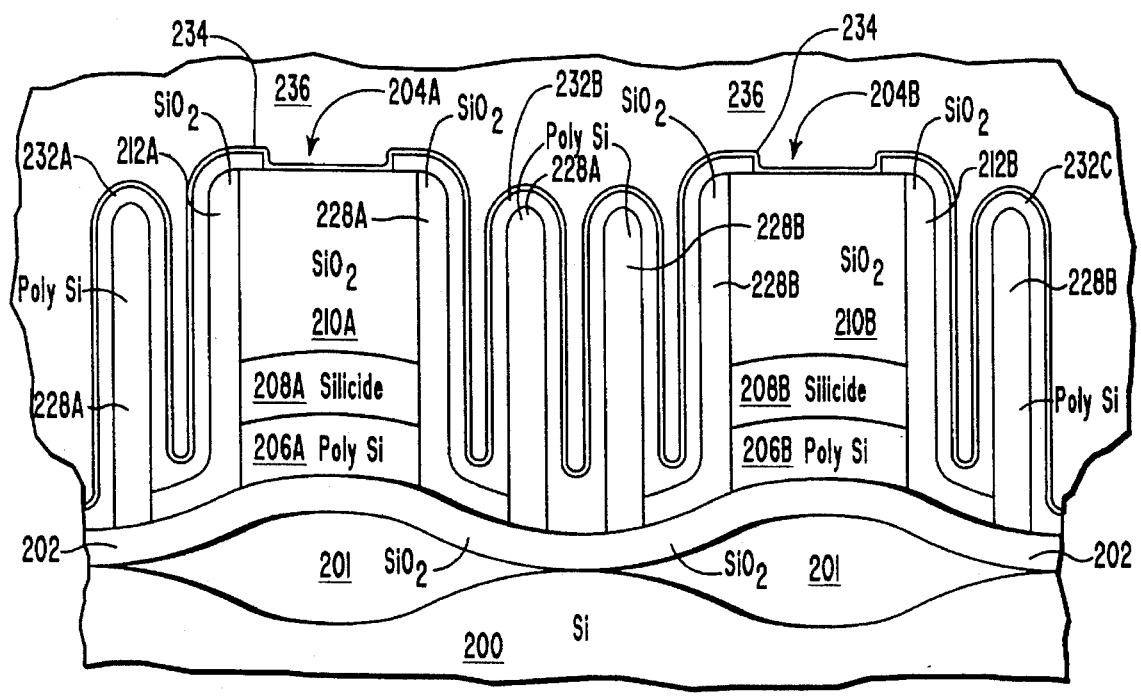
FIGS. 16A–16B represent the formation of the Wave memory cell dielectric layer and the capacitor top plate.
Figure 16B:
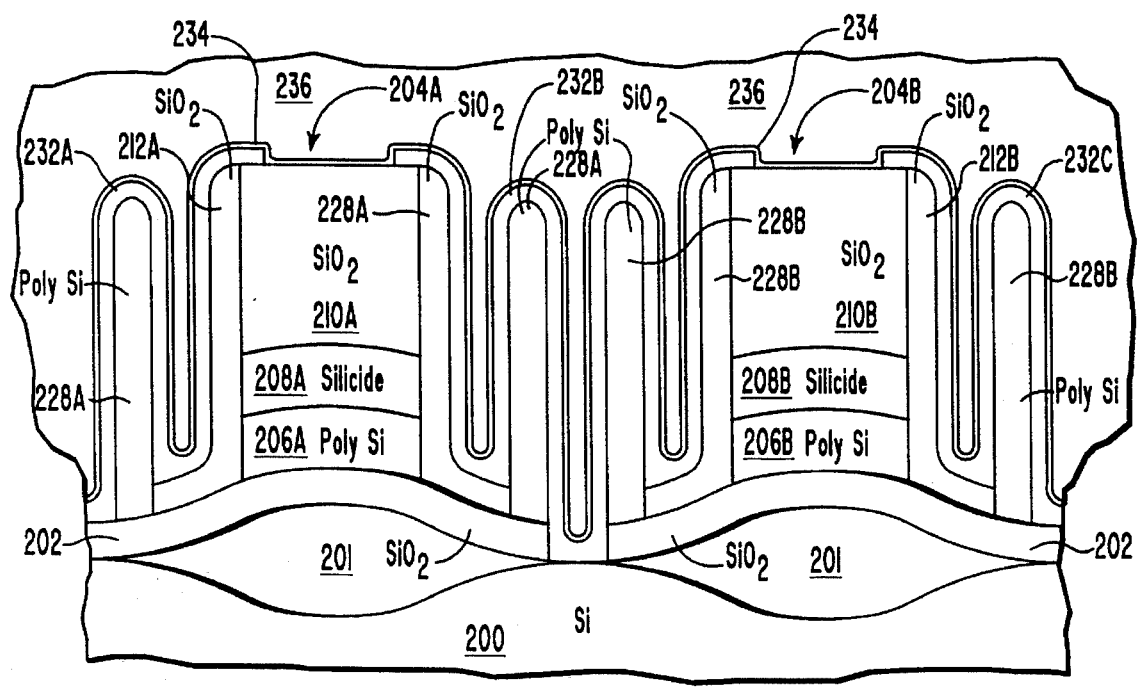

Referring next to FIGS. 16A–B, after the formation of the cell node, e.g., 232B, a thin storage dielectric layer 234 is deposited. As explained in connection with the M cell embodiment, it will be appreciated that a thinner storage dielectric layer is desirable but that as the storage dielectric layer becomes too thin, the occurrence of defects generally increases. Similarly to the M cell embodiment, the storage dielectric layer 234 represented in FIGS. 16A–B is about 50 Å to about 100 Å thick and is comprised of $Si_3N_4$. The $Si_3N_4$ storage dielectric layer 234 is generally reoxidized to remove defects.

Still referring to FIGS. 16A–B, a polysilicon top plate 236 of the cell is deposited on the preceding structures. This polysilicon top plate 128 is generally about 2000 Å to about 4000 Å thick.

Viewing FIGS. 16A–B, it can be appreciated that the storage node 232B, i.e., the capacitor bottom plate, resembles a "Wave" when viewed in cross section. Thus, the term "Wave cell" has been adopted to refer to the structure represented in FIGS. 9–16. Most importantly, the area of the storage node layers, or capacitor bottom plates, has greatly increased over flat capacitor structures occupying the same planar area. Moreover, the present invention provides a reliably fabricated structure having a fully self aligned storage node contact.

From the foregoing, it will be understood that the present invention provides a structure and method for forming an integrated circuit capacitor which provides a higher capacitance per unit of planar area without unduly adding processing steps or complexity to the fabrication of the overall integrated circuit. Further, the present invention provides a structure and method for forming an integrated circuit capacitor structure which provides a high capacitance per unit of planar area occupied by the capacitor, which includes self aligned contacts, and which can be reliably manufactured and operated. The present invention also provides an integrated circuit capacitor structure which provides a higher capacitance per unit of planar area and which is particularly adapted for integration into DRAM memory cells.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A capacitor structure for use on an integrated circuit dynamic random access memory having first and second word lines and first and second parallel digit lines, the integrated circuit being fabricated on a semiconductor substrate, the capacitor structure comprising:

first spacer means for supporting a subsequently formed layer, the first spacer means comprising at least first and second sides, the first spacer means being immediately adjacent to the first digit line;

second spacer means for supporting a subsequently formed layer, the second spacer means comprising at least first and second sides, the second spacer means being immediately adjacent to the second digit line;

a first capacitor plate layer formed on at least a first side of the first spacer means and a first side of the second spacer means and at least a portion of any surface adjoining therebetween;

a dielectric layer formed over the first capacitor plate;

a second capacitor plate formed on the dielectric layer, the sides of the first and second spacer means supporting at least part of the capacitor structure on the integrated circuit; and a third spacer means for supporting a subsequently formed layer, the third spacer means comprising at least first and second sides and positioned between the first and second spacer means and wherein the first capacitor plate layer is formed on the first and second sides of the third spacer means and at least a portion of any surface adjoining between the third spacer means and the first and second spacer means, wherein the capacitor structure has a maximum of two capacitor plates.

2. A capacitor structure for use on an integrated circuit as defined in claim 1, further comprising a fourth spacer means for supporting a subsequently formed layer, the fourth spacer means comprising at least first and second sides and positioned between the second and third spacer means and wherein the first capacitor plate layer is formed on the first and second sides of the fourth spacer means and at least a portion of any surface adjoining between the fourth spacer means and the second and third spacer means.

3. A capacitor structure for use on an integrated circuit as defined in claim 1, wherein each of the spacer means comprise an elongated protrusion extending substantially perpendicularly from the plane of the substrate, the elongated protrusion having a height at least two times as great as its width at its base.

4. A capacitor structure for use on an integrated circuit as defined in claim 2, wherein each of the spacer means comprise an elongated protrusion extending substantially perpendicularly from the plane of the substrate, the elongated protrusion having a height at least two times as great as its width at its base.

5. A capacitive storage node for a dynamic random access memory device, the dynamic random access memory device comprising a first digit line and a second digit line substantially parallel to the first digit line along at least a portion of their length and including a plurality of memory cells all being fabricated on a semiconductor substrate, the capacitive storage node comprising:

a first protrusion formed between the first digit line and the second digit line and immediately adjacent to the first digit line, the first protrusion extending substantially perpendicularly from the plane of the semiconductor substrate, the shape of the first protrusion being substantially elongated and having a first side and a second side;

a second protrusion formed between the second digit line and the first protrusion and immediately adjacent to the second digit line, the second protrusion extending substantially perpendicularly from the plane of the semiconductor substrate, the shape of the second protrusion being substantially elongated and having a first side and a second side;

a first conductive layer formed over at least the first side of the first protrusion, over at least the first side of the second protrusion, and over at least a portion of the surface between the first and the second protrusions, the first conductive layer functioning as a first capacitor plate for an individual memory cell;

a dielectric layer formed over the first conductive layer;

a second conductive layer formed over the dielectric layer, the second conductive layer functioning as a second capacitor plate;

a third protrusion formed between the first protrusion and the second protrusion, the third protrusion extending substantially perpendicularly from the plane of the semiconductor substrate, the shape of the third protrusion being substantially elongated and having a first side and a second side; and a fourth protrusion formed between the third protrusion and the second protrusion, the fourth protrusion extending substantially perpendicularly from the plane of the semiconductor substrate, the shape of the fourth protrusion being substantially elongated and having a first side and a second side, the first conductive layer being formed over at least a portion of the first and second sides of each of the third and fourth protrusions;

wherein the capacitive storage node has a maximum of two capacitor plates.

6. A dynamic random access memory device including a plurality of memory cells, the device comprising:

a semiconductor substrate;

a first word line;

a second word line;

a first digit line;

a second digit line;

a first spacer positioned immediately adjacent to the first digit line and extending substantially perpendicularly from the plane of the semiconductor substrate, the first spacer having first and second sides, the height of the first spacer being at least two times as great as its width at its base, the first spacer being substantially parallel to the first digit line;

a second spacer positioned immediately adjacent to the second digit line and extending substantially perpendicularly from the plane of the semiconductor substrate, the second spacer having first and second sides, the height of the second spacer being at least two times as great as its width at its base, the second spacer being substantially parallel to the second digit line and positioned between the first spacer and the second digit line;

a storage node layer formed on at least the first side of the first spacer and at least the first side of the second spacer and at least some of any space existing between the first and the second spacers;

a dielectric layer formed over the storage node layer;

a cell plate layer formed over the dielectric layer, such that the storage node layer, the dielectric layer, and the cell plate layer together form a memory cell capacitor;

a third spacer extending substantially perpendicularly from the plane of the semiconductor substrate, the third spacer having first and second sides and being substantially parallel to the first digit line and positioned between the first spacer and the second spacer; and a fourth spacer extending substantially perpendicularly from the plane of the semiconductor substrate, the fourth spacer having first and second sides and being substantially parallel to the second digit line and positioned between the third spacer and the second spacer, the storage node layer being further formed on the first and second sides of the third spacer and the first and second sides of the fourth spacer and at least some of any space existing between the third and the fourth spacers;

wherein the first spacer has a height greater than the first digit line and wherein the second spacer has a height greater than the second digit line and wherein the storage node layer is formed over a portion of the first digit line and a portion of the second digit line.

7. A dynamic random access memory device including a plurality of memory cells as defined in claim 6, wherein the memory cell capacitor has a maximum of three layers.

8. A dynamic random access memory device including a plurality of memory cells as defined in claim 6, further comprising a self aligned storage node contact between the storage node layer and the substrate.

9. A dynamic random access memory device including a plurality of memory cells, the device comprising:

a semiconductor substrate;

a first word line;

a second word line;

a first digit line;

a second digit line;

a first spacer positioned immediately adjacent to the first digit line and extending substantially perpendicularly from the plane of the semiconductor substrate, the first spacer having first and second sides, the height of the first spacer being at least two times as great as its width at its base, the first spacer being substantially parallel to the first digit line;

a second spacer positioned immediately adjacent to the second digit line and extending substantially perpendicularly from the plane of the semiconductor substrate, the second spacer having first and second sides, the height of the second spacer being at least two times as great as its width at its base, the second spacer being substantially parallel to the second digit line and positioned between the first spacer and the second digit line;

a storage node layer formed on at least the first side of the first spacer and at least the first side of the second spacer and at least some of any space existing between the first and the second spacers;

a dielectric layer formed over the storage node layer;

a cell plate layer formed over the dielectric layer, such that the storage node layer, the dielectric layer, and the cell plate layer together form a memory cell capacitor;

a third spacer extending substantially perpendicularly from the plane of the semiconductor substrate, the third spacer having first and second sides and being substantially parallel to the first digit line and positioned between the first spacer and the second spacer; and a fourth spacer extending substantially perpendicularly from the plane of the semiconductor substrate, the fourth spacer having first and second sides and being substantially parallel to the second digit line and positioned between the third spacer and the second spacer, the storage node layer being further formed on the first and second sides of the third spacer and the first and second sides of the fourth spacer and at least some of any space existing between the third and the fourth spacers;

wherein the first spacer has a height not greater than the first digit line and wherein the second spacer has a height not greater than the second digit line and wherein the storage node layer is formed over at least a portion of the first digit line and at least a portion of the second digit line.

10. A dynamic random access memory device including a plurality of memory cells as defined in claim 9, wherein the memory cell capacitor has a maximum of three layers.

11. A dynamic random access memory device including a plurality of memory cells as defined in claim 9, further comprising a self aligned storage node contact between the storage node layer and the substrate.

12. A method of fabricating a capacitor structure on an integrated circuit substrate comprising the steps of:

forming a first spacer means for supporting a subsequently formed layer, the first spacer means comprising at least first and second sides;

forming a second spacer means for supporting a subsequently formed layer, the second spacer means comprising at least first and second sides, wherein the step of forming the first spacer means and the step of forming the second spacer means result in the first spacer means and the second spacer means being oriented in a substantially parallel arrangement;

forming a first capacitor plate layer on at least a first side of the first spacer means and a first side of the second spacer means and at least a portion of any surface adjoining therebetween;

forming a dielectric layer over the first capacitor plate;

forming a second capacitor plate on the dielectric layer, the first sides of the first and second spacer means supporting at least part of the capacitor structure on the integrated circuit; and forming a third spacer means for supporting a subsequently formed layer, the third spacer means comprising at least first and second sides, the third spacer means positioned between the first and second spacer means and wherein the first capacitor plate layer is formed on the first and second sides of the third spacer means and at least a portion of any surface adjoining between the third spacer means and the first and second spacer means.

13. A method of fabricating a capacitor structure on an integrated circuit substrate as defined in claim 12, further comprising the step of forming a fourth spacer means for supporting a subsequently formed layer, the fourth spacer means comprising at least first and second sides, the fourth spacer means positioned between the second and third spacer means and wherein the first capacitor plate layer is formed on the first and second sides of the fourth spacer means and at least a portion of any surface adjoining between the fourth spacer means and the second and third spacer means.

14. A method of fabricating a capacitor structure on an integrated circuit substrate as defined in claim 12, wherein the third and fourth spacer means each comprise an elongated protrusion extending substantially perpendicularly from the plane of the substrate, the elongated protrusion having a height at least two times as great as its width at its base.

15. A method of fabricating a capacitor structure on an integrated circuit substrate as defined in claim 13 wherein the third and fourth spacer means each comprise an elongated protrusion extending substantially perpendicularly from the plane of the substrate, the elongated protrusion having a height at least two times as great as its width at its base.

16. A method of fabricating a capacitor structure on an integrated circuit substrate as defined in claim 14, wherein the integrated circuit comprises a dynamic random access memory having a first word line, a second word line, a first digit line, and a second digit line, the first and second digit lines being parallel, and wherein the step of forming the first spacer means comprises the step of forming the first spacer means immediately adjacent to the first digit line and wherein the step of forming the second spacer means comprises the step of forming the second spacer means immediately adjacent to the second digit line.

17. A method of fabricating a capacitor structure on an integrated circuit substrate as defined in claim 15, wherein the integrated circuit comprises a dynamic random access memory having a first word line, a second word line, a first digit line, and a second digit line, the first and second digit lines being parallel, and wherein the step of forming the first spacer means comprises the step of forming the first spacer means immediately adjacent to the first digit line and wherein the step of forming the second spacer means comprises the step of forming the second spacer means immediately adjacent to the second digit line.

18. A method of fabricating a capacitor structure on an integrated circuit substrate as defined in claim 16, wherein the step of forming the first spacer means comprises the step of forming the first spacer means to a height greater than the first digit line and wherein the step of forming the third spacer means comprises the step of forming the third spacer means to a height which is less than the first or second digit lines.

19. A method of fabricating a capacitor structure on an integrated circuit substrate as defined in claim 17, wherein the step of forming the first spacer means comprises the step of forming the first spacer means to a height greater than the first digit line and wherein the step of forming the third spacer means comprises the step of forming the third spacer means to a height which is less than the first or second digit lines.

20. A method of forming a storage node capacitor for a dynamic random access memory device comprising a first digit line and a second digit line substantially parallel to the first digit line, the dynamic random access memory device being fabricated on a substrate, the method comprising the steps of:

forming a first spacer between the first digit line and the second digit line such that the first spacer extends substantially perpendicularly from the substrate, the first spacer being of a generally elongated shape;

forming a second spacer between the second digit line and the first spacer such that the second spacer extends substantially perpendicularly from the substrate, the second spacer being of a generally elongated shape;

forming a first conductive layer over the first spacer, the second spacer, and the surface between the first and the second digit lines, the first conductive layer functioning as a first capacitor plate;

forming a dielectric layer over the first conductive layer;

forming a second conductive layer over the dielectric layer, the second conductive layer functioning as a second capacitor plate such that the substantially vertical area of the first and the second spacers are included in the area of the first conductive layer functioning as a first capacitor plate;

forming a storage node contact between the first conductive layer and the semiconductor substrate; and forming a third spacer, the third spacer comprising at least first and second sides and positioned between the first and second spacers and wherein the first conductive layer is formed on the first and second sides of the third spacer and at least a portion of any surface adjoining between the third spacer and the first and the second spacer.

21. A method of forming a storage node capacitor for a dynamic random access memory device comprising a first digit line and a second digit line as defined in claim 20, further comprising the step of forming a fourth spacer comprising at least first and second sides, the fourth spacer positioned between the second and third spacer and wherein the first capacitor plate layer is formed on the first and second sides of the fourth spacer and at least a portion of any surface adjoining between the forth spacer and the second and third spacers.

22. A method of forming a storage node capacitor for a dynamic random access memory device comprising a first digit line and a second digit line as defined in claims 20, wherein the spacers each comprise an elongated protrusion extending substantially perpendicularly from the plane of the substrate, the elongated protrusion having a height at least two times as great as its width at its base.

23. A method of forming a storage node capacitor for a dynamic random access memory device comprising a first digit line and a second digit line as defined in claims 21, wherein the spacers each comprise an elongated protrusion extending substantially perpendicularly from the plane of the substrate, the elongated protrusion having a height at least two times as great as its width at its base.

* * * * *